(12) United States Patent
Hwang et al.

(10) Patent No.: US 12,091,598 B2
(45) Date of Patent: Sep. 17, 2024

(54) SURFACE-MODIFIED QUANTUM DOTS, PREPARATION METHOD THEREOF, AND QUANTUM DOT-POLYMER COMPOSITE AND ELECTRONIC DEVICE INCLUDING THE SAME

(71) Applicants: KOREA INSTITUTE OF SCIENCE AND TECHNOLOGY, Seoul (KR); IUCF-HYU (Industry-University Cooperation Foundation Hanyang University), Seoul (KR)

(72) Inventors: Gyuweon Hwang, Seoul (KR); Taehwan Park, Seoul (KR); Hyeri Yoo, Seoul (KR); Sangtae Kim, Seoul (KR); Nuri Oh, Seoul (KR); Seungki Shin, Seoul (KR); Namyoung Gwak, Seoul (KR)

(73) Assignees: Korea Institute Of Science And Technology, Seoul (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 74 days.

(21) Appl. No.: 17/881,210

(22) Filed: Aug. 4, 2022

(65) Prior Publication Data
US 2023/0043487 A1   Feb. 9, 2023

(30) Foreign Application Priority Data

Aug. 5, 2021   (KR) .................. 10-2021-0103322
May 30, 2022   (KR) .................. 10-2022-0066361

(51) Int. Cl.
| | | |
|---|---|---|
| *C09K 11/02* | (2006.01) | |
| *B82Y 20/00* | (2011.01) | |
| *B82Y 40/00* | (2011.01) | |
| *C09K 11/08* | (2006.01) | |
| *C09K 11/70* | (2006.01) | |
| *C09K 11/88* | (2006.01) | |
| *H10K 50/115* | (2023.01) | |
| *H10K 85/30* | (2023.01) | |

(52) U.S. Cl.
CPC ........ *C09K 11/025* (2013.01); *C09K 11/0883* (2013.01); *C09K 11/70* (2013.01); *C09K 11/883* (2013.01); *H10K 50/115* (2023.02); *H10K 85/321* (2023.02); *B82Y 20/00* (2013.01); *B82Y 40/00* (2013.01)

(58) Field of Classification Search
CPC . C09K 11/025; C09K 11/0883; C09K 11/883; C09K 11/70; H10K 50/115; H10K 85/321; B82Y 20/00; B82Y 40/00
See application file for complete search history.

(56) References Cited

U.S. PATENT DOCUMENTS

| | | | |
|---|---|---|---|
| 2018/0033856 A1 | 2/2018 | Kwon et al. | |
| 2019/0393435 A1* | 12/2019 | Kim | ............... H01L 31/035218 |
| 2021/0087466 A1 | 3/2021 | Bang et al. | |
| 2021/0130683 A1 | 5/2021 | Zhang | |
| 2021/0210706 A1 | 7/2021 | Yu et al. | |

FOREIGN PATENT DOCUMENTS

| | | |
|---|---|---|
| KR | 2010/0071696 A | 6/2010 |
| KR | 2018/0077086 A | 7/2018 |
| KR | 2018/0119801 A | 11/2018 |
| KR | 10-2019-0143382 A | 12/2019 |
| KR | 2020/0133269 A | 11/2020 |

\* cited by examiner

*Primary Examiner* — C Melissa Koslow
(74) *Attorney, Agent, or Firm* — Harness, Dickey & Pierce, P.L.C.

(57) ABSTRACT

Disclosed are a surface-modified quantum dot surface-modified with a ligand complex having a specific structure on the surface of the semiconductor nanocrystal, a method for preparing the same, and a quantum dot-polymer composite or electronic device including the same.

26 Claims, 23 Drawing Sheets

SURFACE-MODIFIED QUANTUM DOTS, PREPARATION METHOD THEREOF, AND QUANTUM DOT-POLYMER COMPOSITE AND ELECTRONIC DEVICE INCLUDING THE SAME

CROSS-REFERENCE TO RELATED APPLICATION

This application claims priority to and the benefit of Korean Patent Application No. 10-2021-0103322 filed in the Korean Intellectual Property Office on Aug. 5, 2021, and Korean Patent Application No. 10-2022-0066361 filed in the Korean Intellectual Property Office on May 30, 2022, the entire contents of which are incorporated herein by reference.

JOINT RESEARCH AGREEMENT

This invention was supported by Samsung Research Funding & Incubation Center of Samsung Electronics under Project Number SRFC-TB1903-02.

BACKGROUND OF THE INVENTION

(a) Field of the Invention

The present disclosure relates to a surface-modified quantum dot, a preparation method thereof, and a quantum dot-polymer composite or an electronic device including the same.

(b) Description of the Related Art

Quantum dots (also referred to as "semiconductor nanocrystals") have a crystal structure with a size of several nanometers. The quantum dots absorb photons or charge carriers (electrons or holes, or both thereof) from an excitation source, become energetically excited to form excitons, and thus emit energy corresponding to their own energy bandgap. Since the quantum dots have a large surface area per unit volume due to their very small particle sizes and characteristics that bandgaps, emission wavelengths, and the like are changed according to the physical sizes, various developments such as a device, a light emitting diode, and the like by using the same display are being made.

In order to increase efficiency and improve performance of the display or the light emitting diode by using the quantum dots, photoluminescence efficiency (referred to as a "photoluminescence quantum yield", PLQY) of a quantum dot material is important. In order to improve the photoluminescence efficiency and stability of the quantum dots, quantum dots with a core-shell structure have been suggested, but conventional quantum dots with a core-shell structure mostly contain cadmium, which causes serious environmental problems and biohazards. Accordingly, cadmium-free quantum dots have been developed but exhibit low optical properties such as photoluminescence efficiency, compared with the conventional cadmium quantum dots, which need to be improved.

PRIOR ART

Patent Document (Patent Document 1) Korean Patent Laid-Open Publication No. 10-2017-0181392

SUMMARY OF THE INVENTION

An embodiment provides a surface-modified quantum dot having excellent photoluminescence efficiency and stability, and a quantum dot-polymer composite or an electronic device including the same.

Another embodiment provides a method for preparing a surface-modified quantum dot having excellent photoluminescence efficiency and stability.

Another embodiment provides a quantum dot-polymer composite or an electronic device including the surface-modified quantum dot.

According to an embodiment, a quantum dot surface-modified with a ligand complex represented by Chemical Formula 1 is provided.

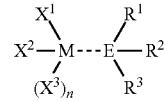

[Chemical Formula 1]

In Chemical Formula 1,
M is a divalent or trivalent metal,
$X^1$, $X^2$, and $X^3$ are each independently a halogen,
n is 0 or 1,
E is a Group 15 element, and
$R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

The divalent or trivalent metal (M) may include zinc (Zn), cadmium (Cd), mercury (Hg), gallium (Ga), aluminum (Al), magnesium (Mg), strontium (Sr), calcium (Ca), barium (Ba), or a combination thereof, and the Group element (E) may include nitrogen (N), phosphorus (P), arsenic (As), antimony (Sb), bismuth (Bi), or a combination thereof.

The semiconductor nanocrystal may be a Group Ill-V compound, and the Group Ill-V compound may further include a Group II element.

The quantum dot may exhibit an area of an oxide peak (about −50 ppm to about 50 ppm) reduced by about 10% or more compared with a quantum dot that is not surface-modified during $^1H$-$^{31}P$ CP MAS (Cross-polarization Magic Angle Spinning) solid state NMR analysis.

Another embodiment provides a quantum dot includes a core including a first semiconductor nanocrystal and a shell including a second semiconductor nanocrystal having a different composition from the first semiconductor nanocrystal, wherein the first semiconductor nanocrystal is a quantum dot surface-modified with a ligand complex represented by Chemical Formula 1.

The first semiconductor nanocrystal may be a Group Ill-V compound, and the Group Ill-V compound may further include a Group II element.

The shell may include a Group II-IV compound, and the Group II-IV compound may include ZnS, ZnSe, or a combination thereof.

The quantum dot may exhibit an area of an oxide peak (about 132 eV to about 134 eV) reduced by about 10% or more compared with a quantum dot prepared using a core that is not surface-modified during X-ray photoelectron spectroscopy (XPS) analysis.

The quantum dots may exhibit an increased photoluminescence quantum yield (PLQY) of about 30% or more with respect to the quantum dot that is not surface-modified.

Another embodiment provides a method for preparing a surface-modified quantum dot that includes injecting a non-metal precursor solution into a reaction solution prepared by injecting a metal precursor into a solvent and reacting them to prepare a semiconductor nanocrystal solution; and injecting the ligand complex represented by Chemical Formula 1 or a solution containing the same into the semiconductor nanocrystal solution, or injecting the compound represented by Chemical Formula 2 and the compound represented by Chemical Formula 3 into the semiconductor nanocrystal solution to form a ligand complex represented by Chemical Formula 1 on the surface of the semiconductor nanocrystal.

$$MX^1X^2(X^3)_n \quad \text{[Chemical Formula 2]}$$

In Chemical Formula 2,

M is a divalent or trivalent metal, $X^1$, $X^2$, and $X^3$ are each independently a halogen, and n is 0 or 1.

$$E(R^1R^2R^3) \quad \text{[Chemical Formula 3]}$$

In Chemical Formula 3,

E is a Group 15 element, and $R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

The method for preparing the surface-modified quantum dot may further include adding a metal salt compound represented by Chemical Formula 4 to the semiconductor nanocrystal solution to etch the surface of the semiconductor nanocrystal before injection of the ligand complex represented by Chemical Formula 1 or the solution containing the same or before injection of the compound represented by Chemical Formula 2 and the compound represented by Chemical Formula 3.

$$M'(Y)_m \quad \text{[Chemical Formula 4]}$$

In Chemical Formula 4,

M' is a monovalent, divalent, or trivalent metal, m is an integer from 1 to 3, and Y is a linear or branched alkyl group, a linear or branched alkenyl group, or a linear or branched alkynyl group which includes a functional group having a C(=O)O— group. Herein the alkyl group may be a C1 to C30 alkyl group, the alkenyl group may be a C2 to C30 alkenyl group, and the alkynyl group may be a C2 to C30 alkenyl group. Specific examples of Y may be an oleate group, a stearate group, a laurate group, a myristate group, and the like.

Another embodiment provides a method of preparing a core-shell quantum dot that includes injecting a non-metal precursor solution into a reaction solution prepared by injecting a metal precursor into a solvent and reacting them to prepare a first semiconductor nanocrystal solution; injecting the ligand complex represented by Chemical Formula 1 or a solution containing the same into the first semiconductor nanocrystal solution, or injecting the compound represented by Chemical Formula 2 and the compound represented by Chemical Formula 3 into the semiconductor nanocrystal solution to form a ligand complex represented by Chemical Formula 1 on the surface of the first semiconductor nanocrystal and to prepare a surface-modified first semiconductor nanocrystal; and forming a shell including a second semiconductor nanocrystal on the surface of the surface-modified first semiconductor nanocrystal.

The method for preparing the core-shell quantum dot may further include adding a metal salt compound represented by Chemical Formula 4 to the first semiconductor nanocrystal solution to etch the surface of the first semiconductor nanocrystal before injection of the ligand complex represented by Chemical Formula 1 or the solution containing the same or before injection of the compound represented by Chemical Formula 2 and the compound represented by Chemical Formula 3.

Another embodiment provides a quantum dot-polymer composite including a plurality of the quantum dots and a polymer matrix in which the quantum dots are disposed.

Another embodiment provides an electronic device including the quantum dots.

The quantum dots may be applied to various electronic devices because of their excellent photoluminescence efficiency, and when applied to a display based on a quantum dot light emitting diode (QD-LED), improved performance may be provided.

DETAILED DESCRIPTION OF THE EMBODIMENTS

Figure 1A:
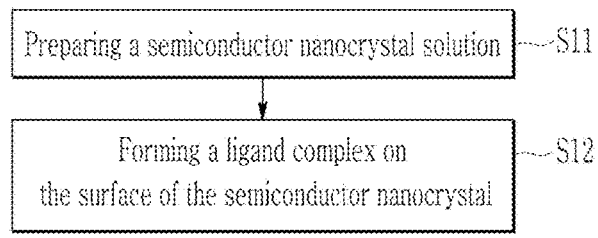
FIG. 1A is a flowchart illustrating a preparing process of a surface-modified quantum dot according to an embodiment.

Hereinafter, embodiments will be described in detail so that those of ordinary skill in the art can easily implement them. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

The singular expression includes the plural expression unless the context clearly dictates otherwise. Herein, it should be understood that terms such as "comprises," "includes," or "have" are intended to designate the presence of an embodied feature, number, step, element, or a combination thereof, but it does not preclude the possibility of the presence or addition of one or more other features, number, step, element, or a combination thereof.

As used herein, when a definition is not otherwise provided, "substituted" refers to replacement of at least one hydrogen of a substituent or a compound by a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including one to three heteroatoms selected from N, O, S, Se, Te, Si, and P.

As used herein, when a definition is not otherwise provided, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarter phenyl group, and the like, and a group in which two or more hydrocarbon aromatic moieties are fused directly or indirectly to provide a non-aromatic fused ring, for example, a fluorenyl group, and the like.

As used herein, when a definition is not otherwise provided, "heteroaryl group" contains at least one hetero atom selected from N, O, S, Se, Te, P, and Si instead of carbon (C) in the ring. When the heteroaryl group is a fused ring, at least one of the rings constituting the heteroaryl group may have a hetero atom, and each ring may have a hetero atom.

Hereinafter, "combination" refers to a mixture, an alloy, or a laminate structure of two or more.

As used herein, the term "Group" in terms of Group II, Group III, etc. refers to a group of the Periodic Table of Elements.

As used herein, "Group II" refers to Group IIA and Group IIB, and examples of Group II metal may include Mg, Ca, Sr, Zn, Cd, and Hg, but are not limited thereto.

As used herein, "Group III" refers to Group IIIA and Group IIIB, and examples of Group III metal may include Al, In, Ga, and TI, but are not limited thereto.

As used herein, "Group IV" refers to Group IVA and Group IVB, and examples of a Group IV metal may include Si, Ge, and Sn, but are not limited thereto. As used herein, the term "metal" may include a semi-metal such as Si.

As used herein, "Group V" refers to Group VA, and examples thereof may include nitrogen, phosphorus, arsenic, antimony, and bismuth, but are not limited thereto.

As used herein, "Group VI" refers to Group VIA, and examples thereof may include sulfur, selenium, and tellurium, but are not limited thereto.

Hereinafter, quantum dots according to an embodiment are described.

An embodiment provides a cadmium-free colloidal quantum dot having improved optical properties, particularly photoluminescence efficiency, by surface modification with a ligand complex having a specific structure.

Specifically, the quantum dot according to an embodiment is surface-modified with a ligand complex represented by Chemical Formula 1.

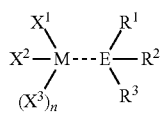

[Chemical Formula 1]

In Chemical Formula 1,

M is a divalent or trivalent metal, $X^1$, $X^2$, and $X^3$ are each independently halogen (e.g., Cl, Br, or I), n is 0 or 1, E is a Group 15 element, and $R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

The divalent or trivalent metal (M) may be a transition metal such as zinc (Zn), cadmium (Cd), or mercury (Hg); a Group 13 metal such as aluminum (Al) and gallium (Ga); or an alkaline earth metal such as magnesium (Mg), strontium (Sr), calcium (Ca), and barium (Ba), and the Group 15 element (E) may be nitrogen (N), phosphorus (P), arsenic (As), antimony (Sb), bismuth (Bi), or a combination thereof.

In $R^1$, $R^2$, and $R^3$ of Chemical Formula 1, a methylene group (—$CH_2$—) of the substituted or unsubstituted C1 to C30 alkyl group, the substituted or unsubstituted C2 to C30 alkenyl group, or the substituted or unsubstituted C2 to C30 alkynyl group may be replaced by a divalent linking group of —O—, —S—, —C(=O)—, —S(=O)—, —C(=O)O—, —OC(=O)—, or a combination thereof.

In $R^1$, $R^2$, and $R^3$ of Chemical Formula 1, "a combination thereof" refers to a substituent in which a substituted or unsubstituted C1 to C30 alkyl group, a substituted or unsubstituted C2 to C30 alkenyl group, or a substituted or unsubstituted C2 to C30 alkynyl group is linked to an unsubstituted C6 to C30 aryl group or a substituted or unsubstituted C1 to C30 heteroaryl group, for example, an aralkyl group such as a benzyl ($C_6H_5CH_2$—) group, a phenethyl ($C_6H_5CH_2CH_2$—) group, etc.

The semiconductor nanocrystal may be a Group III-V compound. The Group III-V semiconductor compound may include, for example, a binary semiconductor compound selected from GaN, GaP, GaAs, GaSb, AlN, AlP, AlAs, AlSb, InN, InP, InAs, InSb, and a mixture thereof; a ternary semiconductor compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary semiconductor compound selected from GaAlNPs, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

In an embodiment, the semiconductor nanocrystal may be a Group III-V compound, and the Group III-V compound may further include a Group II element.

For example, the Group III-V compound may be InP or InAs, and may further include zinc (Zn). In an embodiment, the semiconductor nanocrystals may include InP, In(Zn)P, InAs, or In(Zn)As. As such, when zinc is further included in the synthesis of semiconductor nanocrystals, the InP or InAs core may be made smaller and more uniform to have an emission region of a shorter wavelength, for example, a green wavelength band in the case of InP.

The Group 15 element of the ligand complex may be the same as the non-metal element (Group V element) of the semiconductor nanocrystal.

The ligand complex represented by Chemical Formula 1 may be stabilized by binding to the surface of the semiconductor nanocrystal as a coordination binder. Accordingly, it is possible to reduce the oxide formed by the reaction of the non-metal element of the semiconductor nanocrystal with oxygen. The ligand complex may exist as a coordination binder or may be decomposed and present by being bound to a non-metal element (e.g., P or As in the case of a Group III-V compound) of a semiconductor nanocrystal, respectively.

The quantum dots may exhibit an area of an oxide peak (about −50 ppm to about 50 ppm) reduced by about 10% or more, for example about 20% or more, about 30% or more, about 40% or more, or about 50% or more compared with quantum dots that are not surface-modified during $^1$H-$^{31}$P CP MAS (Cross-polarization Magic Angle Spinning) solid state NMR analysis.

The quantum dots may exhibit an area of an oxide peak (about 132 eV to about 134 eV) reduced by about 10% or more, for example about 20% or more, about 30% or more, about 40% or more, or about 50% or more compared with quantum dots that are not surface-modified during X-ray photoelectron spectroscopy (XPS) analysis.

In the ligand complex, the compound (Group 15 element-containing compound, pnictogenide) represented by E($R^1R^2R^3$) stabilizes the surface of the quantum dot (passivation), thereby reducing surface trapping in the quantum dot, and thus optical properties of the quantum dot, especially the photoluminescence quantum yield (PLQY) may be improved. In an embodiment, the photoluminescence quantum yield (PLQY) may be increased by about 30% or more, for example, by 40% or more compared with the quantum dots that are not surface-modified. Herein, the "photoluminescence quantum yield (PLQY)" is a value defined as the ratio of the number of photons emitted by the quantum dot to the number of photons absorbed by the quantum dot.

In an embodiment, a molar ratio of the semiconductor nanocrystal to the ligand complex may be about 1:100 to about 1:10,000. Specifically, the molar ratio of the semiconductor nanocrystal to the ligand complex is about 1:100 or more, about 1:200 or more, about 1:300 or more, about 1:400 or more, about 1:500 or more, about 1:600 or more, about 1:700 or more, about 1:800 or more, about 1:900 or more, about 1:1000 or more, or about 1:1500 or more, and about 1:10000 or less, about 1:9000 or less, about 1:8000 or less, about 1:7000 or less, about 1:6000 or less, about 1:5000 or less, about 1:4000 or less, about 1:3000 or less, or about 1:2000 or less. More specifically, it may be about 1:500 to about 1:2000. When the molar ratio of the semiconductor nanocrystal to the ligand complex is within the above ranges, the surface modification effect may be improved.

The surface-modified quantum dots as described above may further form a shell on the surface thereof to provide a quantum dot having a core-shell structure with improved stability.

A core-shell quantum dot having such a structure includes a core including a first semiconductor nanocrystal and a shell including a second semiconductor nanocrystal having a different composition from the first semiconductor nanocrystal, wherein the first semiconductor nanocrystal is surface-modified with the ligand complex represented by Chemical Formula 1.

The first semiconductor nanocrystal may be a Group III-V compound, and the second semiconductor nanocrystal may be a Group II-VI compound. The Group III-V compound is the same as described in the aforementioned embodiment.

The shell may include one or two or more layers. When the shell includes two or more layers, each layer may have the same or different composition from each other. In an embodiment, the shell may include a crystalline or amorphous material. Specifically, the shell may include at least one of a binary compound selected from ZnS, ZnSe, ZnTe, HgS, HgSe, HgTe, MgSe, MgS, and a mixture thereof; a ternary compounds selected from ZnSeS, ZnSeTe, ZnSTe, HgSeS, HgSeTe, HgSTe, HgZnS, HgZnSe, HgZnTe, MgZnSe, MgZnS, and a mixture thereof; and a quaternary compound selected from HgZnTeS, HgZnSeS, HgZnSeTe, HgZnSTe, and a mixture thereof. More specifically, the shell may include ZnS, ZnSe, or ZnSeS.

The shell may effectively stabilize the traps present on the surface of the core to increase the photoluminescence efficiency, and protect the core from oxidation reactions or other damage or adverse effects caused by environmental changes and light/moisture/oxygen to improve stability. In view of the above, the molar ratio of anion atoms of the second semiconductor nanocrystal contained in the shell to the first semiconductor nanocrystal contained in the core according to an embodiment is about 1:200 or more, about 1:300 or more, about 1:400 or more, about 1:500 or more, about 1:600 or more, about 1:700 or more, about 1:800 or more, about 1:900 or more, or about 1:1000 or more. In an embodiment, the molar ratio of anion atoms of the second semiconductor nanocrystal to the first semiconductor nanocrystal may be about 1:3000 or less, or about 1:2500 or less. The quantum dots may be cadmium-free (Cd-free) quantum dots that do not contain cadmium (Cd). Since the quantum dots do not contain cadmium, occurrence of environmental problems due to cadmium may be prevented.

In an embodiment, the ligand complex represented by Chemical Formula 1 that surface-modifies the core is expected to modify the interface between the core and the shell when the shell is formed thereafter. The surface-modification of the core using the ligand complex represented by Chemical Formula 1 as described above has advantages in that the quantum yield of the quantum dot core itself is significantly higher as well as less risk and harm than conventional hydrofluoric acid and hydrofluoric acid salts.

The core-shell quantum dots may exhibit an area of an oxide peak (about 132 eV to about 134 eV) reduced by about 10% or more, for example about 20% or more, about 30% or more, about 40% or more, about 50% or more, about 60% or more, about 70% or more, about 80% or more, or about 90% or more, compared with quantum dots prepared using a core that is not surface-modified during X-ray photoelectron spectroscopy (XPS) analysis.

In the core-shell quantum dot of the aforementioned structure, the ligand complex represented by Chemical Formula 1 binds well to a metal and/or non-metal element present on the surface of the core to reduce a density of mid-gap trap state of the core-shell structure.

Hereinafter, a method of preparing the surface-modified quantum dots is described with reference to FIG. 1A. FIG. 1A is a flowchart illustrating a preparing process of a surface-modified quantum dot according to an embodiment.

Referring to FIG. 1A, the method for preparing a surface-modified quantum dot includes injecting a non-metal precursor solution into a reaction solution prepared by injecting a metal precursor into a solvent and reacting them to prepare a semiconductor nanocrystal solution (S11); and injecting the ligand complex represented by Chemical Formula 1 or a solution containing the same into the semiconductor nanocrystal solution, or injecting the compound represented by Chemical Formula 2 and the compound represented by Chemical Formula 3 into the semiconductor nanocrystal solution to form a ligand complex represented by Chemical Formula 1 bound to the surface of the semiconductor nanocrystal (S12).

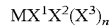   [Chemical Formula 2]

In Chemical Formula 2,

M is a divalent or trivalent metal, $X^1$, $X^2$, and $X^3$ are each independently a halogen, and n is 0 or 1.

   [Chemical Formula 3]

In Chemical Formula 3,

E is a Group 15 element, $R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

First, a non-metal precursor solution is injected into a reaction solution prepared by injecting a metal precursor into a solvent and reacted to prepare a semiconductor nanocrystal solution (S11).

The solvent may be an organic solvent, and specifically, C6 to C22 primary amines such as hexadecylamine; C6 to C22 secondary amines such as dioctylamine; C6 to C40 tertiary amines such as trioctylamine; C6 to C40 aliphatic hydrocarbons such as hexadecane, octadecane, octadecene, and squalene; C6 to C30 aromatic hydrocarbons such as phenyldodecane, phenyltetradecane, and phenyl hexadecane; phosphine substituted with a C6 to C22 alkyl group such as trioctylphosphine; phosphine oxide substituted with a C6-C22 alkyl group, such as trioctylphosphine oxide; C12 to C22 aromatic ethers such as phenyl ether, benzyl ether, and a combination thereof, but is not limited thereto. Any organic solvent having a high boiling point relative to the reaction temperature may be used.

In an embodiment, a content of the metal precursor included in the solvent in the step of preparing the semiconductor nanocrystal solution is not limited, but may be, for example, about 0.6 mmol to about 1.2 mmol based on 10 ml of the solvent.

When the metal precursor is an indium precursor, the indium precursor may include, but is not limited to, indium acetate, trimethyl indium, indium hydroxide, indium chloride, indium oxide, or indium nitrate.

When the metal precursor is an indium precursor, the step of preparing the semiconductor nanocrystal may further include adding a zinc precursor to a solution into which the indium precursor is injected. In an embodiment, the zinc precursor may be zinc acetate, dimethyl zinc, diethyl zinc, zinc acetylacetonate, zinc iodide, zinc bromide, zinc chloride, zinc fluoride, zinc carbonate, zinc cyanide, zinc nitrate, zinc oxide, zinc peroxide, or zinc perchlorate, but is not limited thereto. A content of the zinc precursor is not limited, but, for example, a molar ratio of the indium precursor to the zinc precursor may be about 2:1 to about 1:2.

In an embodiment, an organic ligand may be further added to the solution into which the metal precursor is injected, in the step of preparing the semiconductor nanocrystal. The type of the organic ligand is not limited, but may be, for example, a carboxylic acid such as oleic acid, myristic acid, palmitic acid, or lauric acid. A content of the organic ligand is not limited, but, for example, a molar ratio of the metal precursor to the organic ligand may be about 1:2 to about 1:4. In the above content range, uniformity of the particles may be improved.

In an embodiment, the step of injecting the metal precursor into a solvent and reacting may include degassing the reaction solution by heating it to a temperature of about 50° C. to about 150° C., and then reacting it at about 200° C. to about 280° C. Specifically, the degassing temperature may be greater than or equal to about 50° C., greater than or equal to about 60° C., greater than or equal to about 70° C., greater than or equal to about 80° C., greater than or equal to about 90° C., or greater than or equal to about 100° C., and less than or equal to about 150° C., less than or equal to about 140° C., less than or equal to about 130° C., less than or equal to about 120° C., or less than or equal to about 110° C. Specifically, the reaction temperature may be greater than or equal to about 200° C., greater than or equal to about 210° C., greater than or equal to about 220° C., greater than or equal to about 230° C., greater than or equal to about 240° C., and less than or equal to about 280° C., less than or equal to about 270° C., less than or equal to about 260° C., less than or equal to about 250° C., or less than or equal to about 240° C. In an embodiment, the method may further include lowering the temperature again after preparing the metal-carboxylate by the above reaction.

The step of injecting the non-metal precursor solution into the reaction solution and reacting them may include heating the reaction solution to a temperature of about 110° C. to about 260° C. to react them. In this case, the reaction time may be about 1 hour to about 2 hours. Specifically, the reaction temperature may be greater than or equal to about 110° C., greater than or equal to about 120° C., greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C., and less than or equal to about 260° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., or less than or equal to about 120° C., but is not limited thereto and may be adjusted depending on the size or wavelength of the desired quantum dot.

When the non-metal precursor is a phosphorus precursor, the phosphorus precursor may be tristrimethylsilyl phosphine ((TMS)$_3$P), tris(dimethylamino)phosphine, triethylphosphine, tributylphosphine, trioctylphosphine, triphenylphosphine, and tricyclohexylphosphine, but are not limited thereto.

When the non-metal precursor is an arsenic precursor, the arsenic precursor may be tristrimethylsilyl arsine ((TMS)$_3$As), tristrimethylgermanyl arsine ((TMGe)$_3$As), tris(dimethylamino) arsine, and trisisopropyldimethylsilsyl arsine ((iPrDMS)$_3$As), but is not limited thereto.

A molar ratio of the injected metal precursor to the non-metal precursor may be about 1:0.5 to about 1:1. Specifically, the molar ratio of the non-metal precursor to the metal precursor may be greater than or equal to about 0.5, greater than or equal to about 0.6, or greater than or equal to about 0.7, and less than or equal to about 1, less than or equal to about 0.9, less than or equal to about 0.8, or less than or equal to about 0.7. More specifically, the molar ratio of the metal precursor to the non-metal precursor may be about 1:0.5 to about 1:0.7. Within the range of the molar ratio, a semiconductor nanocrystal having a uniform composition may be obtained.

By injecting a ligand complex represented by Chemical Formula 1 or a solution containing the same or a compound represented by Chemical Formula 2 and a compound represented by Chemical Formula 3 into the semiconductor nanocrystal solution prepared above, the ligand complex represented by Chemical Formula 1 is bonded to the surface of the semiconductor nanocrystal to surface-modify semiconductor nanocrystal (S12).

In the step (S12) of surface-modifying the semiconductor nanocrystal, the compound of Chemical Formula 2 and the compound of Chemical Formula 3 are mixed in advance to form a ligand complex of Chemical Formula 1, and then injected into the semiconductor nanocrystal solution, or the compound of Chemical Formula 2 and the compound of Chemical Formula 3 may be respectively injected into the semiconductor nanocrystal solution to form the ligand complex of Chemical Formula 1 on the surface of the semiconductor nanocrystal. In addition, when the compound of Chemical Formula 2 and the compound of Chemical Formula 3 are respectively injected, the compounds may be injected simultaneously or may be injected continuously into the semiconductor nanocrystal solution.

Specific examples of the compound represented by Chemical Formula 2 may be $ZnCl_2$, $ZnBr_2$, $ZnI_2$, $CdCl_2$, $CdBr_2$, $CdI_2$, $HgCl_2$, $GaCl_3$, or $AlCl_3$, but are not limited thereto.

Specific examples of the compound represented by Chemical Formula 3 may include ammonia, an alkyl amine, an arylamine, hydrogen phosphine, an alkyl phosphine, an aryl phosphine, or a combination thereof. For example, the compound in which the Group 15 element in Chemical Formula 3 is nitrogen (N) may be ammonia, a primary alkyl amine, a secondary alkyl amine, or a tertiary alkyl amine. For example, in Chemical Formula 3, the compound in which the Group 15 element is phosphorus (P) may be hydrogen phosphine, primary alkyl phosphine, secondary alkyl phosphine or tertiary alkyl phosphine, for example, trioctylphosphine (TOP, P(C8H17)₃) or aryl phosphine. Herein, the alkyl may be a C1 to C30 alkyl, and the aryl may be a C6 to C30 aryl.

The compound of Chemical Formula 2 and the compound of Chemical Formula 3 react with each other to form the ligand complex represented by Chemical Formula 1. The formation of the ligand complex may be confirmed by $^{31}$P NMR. Each constituent element of Chemical Formulas 2 and 3 is the same as described in Chemical Formula 1.

In the step (S12) of surface-modifying the semiconductor nanocrystal, an additional metal precursor may be further injected into the semiconductor nanocrystal solution together with the ligand complex represented by Chemical Formula 1 or a solution containing the same. In addition, when the compound represented by Chemical Formula 2 and the compound represented by Chemical Formula 3 are respectively injected, an additional metal precursor may be further injected together with them. The additional metal precursor may include a metal different from the metal of the semiconductor nanocrystal. For example, when the metal of the semiconductor nanocrystal is a Group III metal, the additional metal precursor may be a Group II metal. The additional metal precursor may include a metal element of a shell that may be formed on the semiconductor nanocrystal. For example, when the semiconductor nanocrystal is a Group III-V compound, the additional metal precursor may be a zinc precursor, and the type thereof is as described above.

The compound represented by Chemical Formula 2 and the compound represented by Chemical Formula 3 may be used in a molar ratio of about 1:1 to about 1:4.

The reaction temperature of the step of surface-modifying the semiconductor nanocrystal may be about 80° C. to about 350° C., but is not limited thereto. Specifically, the reaction temperature may be greater than or equal to about 80° C., greater than or equal to about 100° C., greater than or equal to about 120° C., greater than or equal to about 140° C., greater than or equal to about 160° C., greater than or equal to about 180° C., greater than or equal to about 200° C., greater than or equal to about 210° C., greater than or equal to about 250° C., greater than or equal to about 260° C., greater than or equal to about 270° C., greater than or equal to about 280° C., greater than or equal to about 290° C., or greater than or equal to about 300° C., and less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C., but is not limited thereto. The reaction temperature may be adjusted depending on the desired degree of surface-modification. In an embodiment, when the reaction temperature of the step of surface-modifying the semiconductor nanocrystal may be greater than or equal to about 200° C., optical properties may be remarkably improved.

The reaction time of the step of surface-modifying the core may be about 1 minute or more, about 5 minutes or more, about 10 minutes or more, about 20 minutes or more, about 30 minutes or more, about 40 minutes or more, about 50 minutes or more, about 60 minutes or more, about 70 minutes or more, about 80 minutes or more, about 90 minutes or more, about 100 minutes or more, about 110 minutes or more, about 120 minutes or more, about 130 minutes or more, or about 140 minutes or more, and about 150 minutes or less, about 140 minutes or less, about 130 minutes or less, about 120 minutes, about 110 minutes or less, about 100 minutes or less. or less, about 90 minutes or less, about 80 minutes or less, about 70 minutes or less, about 60 minutes or less, about 50 minutes or less, about 40 minutes or less, about 30 minutes or less, about 20 minutes or less, about 10 minutes or less, or about 5 minutes or less.

The method for preparing the surface-modified quantum dots further includes the step of etching the surface of the semiconductor nanocrystals by injecting a metal salt compound represented by Chemical Formula 4 after preparing the semiconductor nanocrystal solution (S11) and before the surface-modification step (S12). The metal salt compound represented by Chemical Formula 4 may be a saturated or unsaturated organic acid salt.

$$M'(Y)_m \quad \text{[Chemical Formula 4]}$$

In Chemical Formula 4,

M' is a monovalent, divalent, or trivalent metal, m is an integer of 1 to 3, and Y is a linear or branched alkyl group, a linear or branched alkenyl group, or a linear or branched alkynyl group which includes a functional group having a C(=O)O— group. Herein, the alkyl group may be a C1 to C30 alkyl group (e.g., a C6 to C30 alkyl group, a C8 to C30 alkyl group, or a C8 to C20 alkyl group); the alkenyl group may be a C2 to C30 alkenyl group (e.g., a C6 to C30 alkenyl group, a C8 to C30 alkenyl group, or a C8 to C20 alkenyl group); and the alkynyl group may be a C2 to C30 alkenyl group (e.g., a C6 to C30 alkynyl group, a C8 to C30 alkynyl group, or a C8 to C20 alkynyl group).

Specific examples of Y may be a C2 to C30 (e.g., C6 to C30, C8 to C30 or C8 to C20) carboxylate group, for example, an oleate group, a palmitate group, a stearate group, a laurate group, a myristate group, a caprate group, a caproleate group, a lauroleate group, a myristoleate group, an acetate group, a butyrate group, and the like. That is, specific examples of the compound represented by Chemical Formula 4 may include zinc oleate $(Zn(OA)_2)$, zinc palmitate, zinc stearate, zinc laurate, zinc myristate, zinc caprate, zinc caproleate, zinc lauroleate, zinc myristoleate, and the like.

Specifically, the surface-etching step may be a process of etching the semiconductor nanocrystal solution by injecting the semiconductor nanocrystal solution after degassing in a container containing the compound of Chemical Formula 4 at about 50° C. to about 150° C. for about 10 minutes to about 50 minutes. In an embodiment, the compound of Chemical Formula 4 may be included in an organic solvent and present in a solution state, and the organic solvent may be the organic solvent described above in the semiconductor nanocrystal solution. In an embodiment, the compound of Chemical Formula 4 may be included in an amount of about 0.5 mmol to about 4 mmol based on 1 ml of the semiconductor nanocrystal solution. More specifically, the content of the compound of Chemical Formula 4 may be greater than or equal to about 0.5 mmol, greater than or equal to about 1 mmol, greater than or equal to about 1.5 mmol, or greater than or equal to about 2 mmol, and less than or equal to about 4 mmol, less than or equal to about 3.5 mmol, less than or equal to about 3 mmol, or less than or equal to about 2.5 mmol based on 1 ml of the semiconductor nanocrystal solution.

In general, Group III-V semiconductor nanocrystals containing indium (In) and phosphorus (P) or arsenic (As) have an indium-terminated surface. When the surface of the semiconductor nanocrystal is etched, phosphorus (P) or arsenic (As) atoms contained in the semiconductor nanocrystals are exposed. When the ligand complex represented by Chemical Formula 1 is formed thereon, photoluminescence quantum yield (PLQY) may be further increased.

Figure 1B:
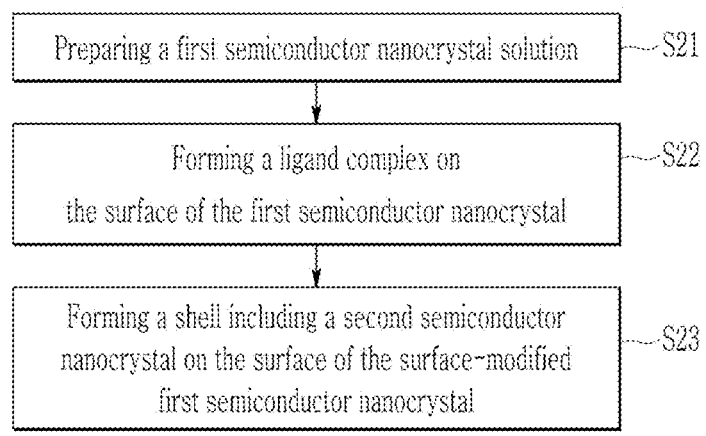
FIG. 1B is a flowchart showing a preparing process of the surface-modified quantum dot according to another embodiment.

A method of preparing a quantum dot having a core-shell structure in which a shell is further formed on the surface of the surface-modified quantum dot as described above is described with reference to FIG. 1B. FIG. 1B is a flowchart showing a preparing process of the surface-modified quantum dots according to another embodiment.

Referring to FIG. 1B, a method for preparing a quantum dot having a core-shell structure according to an embodiment includes injecting a non-metal precursor solution into a reaction solution prepared by injecting a metal precursor into a solvent and reacting them to prepare a first semiconductor nanocrystal solution (S21); injecting the ligand complex represented by Chemical Formula 1 or the solution containing the same into the first semiconductor nanocrystal solution, or injecting the compound represented by Chemical Formula 2 and the compound represented by Chemical Formula 3 into the first semiconductor nanocrystal solution to form the ligand complex represented by Chemical Formula 1 and to prepare a surface-modified first semiconductor nanocrystal (S22); and forming a shell including a second semiconductor nanocrystal on the surface of the surface-modified first semiconductor nanocrystal (S23).

The preparing step (S21) of the semiconductor nanocrystal solution and the step (S22) of preparing the surface-modified first semiconductor nanocrystals are the same as the aforementioned preparing step (S11) of the semiconductor nanocrystal solution and preparing step (S12) of the surface-modified semiconductor nanocrystals.

In the step of forming the shell (S23), one or more of selenium (Se) and sulfur (S) precursors are injected into a solution containing the surface-modified first semiconductor nanocrystals (core) and reacted to form the shell. At this time, the shell may be grown at the same temperature by rapidly injecting one or more of the selenium (Se) and sulfur (S) precursors after the surface-modification step of the core, wherein the shell formation time may be about 15 minutes to about 60 minutes.

In an embodiment, the step of injecting and reacting at least one of the selenium (Se) and sulfur (S) precursors to form the shell may be performed by injecting only one of the selenium precursor and the sulfur precursor, or injecting the selenium precursor and the sulfur precursor at the same time. Alternatively, in the step, a shell may be formed by injecting at least one of a selenium precursor and a sulfur precursor, and then sequentially injecting the other one of the two precursors.

In an embodiment, the selenium precursor is not limited, but may include selenium-trioctylphosphine, selenium-tributylphosphine, or selenium-triphenylphosphine. In an embodiment, the sulfur precursor is not limited, but may include sulfur-trioctylphosphine, sulfur-tributylphosphine, sulfur-triphenylphosphine, sulfur-trioctylamine, bis(trimethylsilyl)sulfide, ammonium sulfide, sodium sulfide, sulfur-octanethiol, sulfur-dodecanthiol, and the.

In an embodiment, a molar ratio of the first semiconductor nanocrystal: at least one of selenium (Se) and sulfur (S) may be about 1:100 to about 1:3,000. Specifically, the first semiconductor nanocrystal: the molar ratio of at least one of selenium and sulfur (S) is about 1:100 or more, about 1:200 or more, about 1:300 or more, about 1:400 or more, about 1:500 or more, about 1:600 or more, about 1:700 or more, about 1:800 or more, or about 1:900 or more, and about 1:1000 or less, about 1:900 or less, about 1:800 or less, about 1:700 or less, about 1:600 or less, about 1:500 or less, about 1:400 or less, about 1:300 or less, or about 1:200 or less. More specifically, it may be about 1:200 to about 1:2000.

As an example, a method for preparing a core/shell quantum dot in which the first semiconductor nanocrystal is InP may include injecting a phosphorus precursor or an arsenic precursor into the reaction solution in which an indium precursor is added into a solvent and reacting the same to prepare an InP core solution; evaporating a solvent of the InP core solution to form a core; injecting the ligand complex represented by Chemical Formula 1 into the core, or injecting the compound represented by Chemical Formula 2 and the compound represented by Chemical Formula 3, respectively to surface-modify the core; and forming a shell on the surface of the surface-modified core.

The quantum dots may absorb light having a wavelength in the range of about 250 nm to about 700 nm or shorter than this range, and may have an emission wavelength in the range of about 400 nm to about 700 nm, but is not limited thereto, and the emission wavelength may be easily adjusted depending on the composition, size, etc. of the quantum dots. In an embodiment, the quantum dots may have a maximum photoluminescence peak in a wavelength region of red light, green light, or blue light. In an embodiment, the full width at half maximum (FWHM) of the maximum photoluminescence peak may be less than or equal to about 100 nm. More specifically, the full width at half maximum of the maximum photoluminescence peak represented by the quantum dot may be less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

A particle diameter of the quantum dots is not limited, but a maximum diameter of the particles may be about 1 nm to about 20 nm. In an embodiment, a shape of the quantum dots is not limited, but may have, for example, a spherical shape, a cubic shape, a pyramid shape, a rod shape, or the like.

In an embodiment, a quantum dot-polymer composite includes a polymer matrix and a plurality of quantum dots disposed in the polymer matrix, wherein the quantum dots include the quantum dots according to the aforementioned embodiment. The quantum dots may be dispersed in a polymer matrix and included in a mixed state. In an embodiment, the polymer matrix may include a thiolene resin, an acrylic resin, a urethane-based resin, an epoxy-based resin, a vinyl-based resin, a silicone-based resin, or a combination thereof.

The quantum dots and the quantum dot-polymer composite may be used in various light emitting devices.

Figure 2:
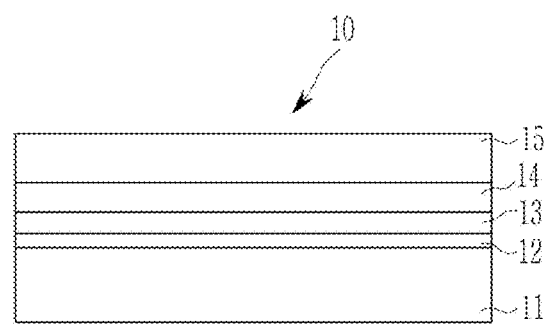
FIG. 2 is a cross-sectional view schematically illustrating a light emitting device according to an embodiment.

Hereinafter, a light emitting device is described with reference to FIG. 2. FIG. 2 is a cross-sectional view schematically illustrating a light emitting device according to an embodiment.

Referring to FIG. 2, a light emitting device 10 according to an embodiment includes a first electrode 11 and a second electrode 15 facing each other, a light emitting layer 13 between the first electrode 11 and the second electrode 15, a hole auxiliary layer 12 between the first electrode 11 and the light emitting layer 13, and an electron auxiliary layer 14 between the second electrode 15 and the light emitting layer 13.

A substrate (not shown) may be disposed on a surface of the first electrode 11 or a surface of the second electrode 15. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 11 and the second electrode 15 is an anode and the other is a cathode. For example, the first electrode 11 may be an anode and the second electrode 15 may be a cathode.

The first electrode 11 may be made of a conductor having a high work function, for example, a metal, a conductive metal oxide, or a combination thereof. The first electrode 11 may be, for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The second electrode 15 may be made of a conductor having a lower work function than the first electrode 11, and may be made of, for example, a metal, a conductive metal oxide, and/or a conductive polymer. The second electrode 15 may include, for example, a metal such as aluminum, magnesium, calcium, sodium, potassium, titanium, indium, yttrium, lithium, gadolinium, silver, tin, lead, cesium, barium, or an alloy thereof; and a multi-layer structure material such as LiF/Al, $LiO_2$/Al, Liq/Al, LiF/Ca, and $BaF_2$/Ca, but is not limited thereto.

The light emitting layer 13 includes the aforementioned quantum dots.

The hole auxiliary layer 12 may be disposed between the first electrode 11 and the light emitting layer 13. The hole auxiliary layer 12 may have one or more layers, and may include, for example, a hole injection layer, a hole transport layer, and/or an electron blocking layer.

The hole auxiliary layer 12 may include, for example, at least one of poly[(9,9-dioctylfluorenyl-2,7-diyl)-co-(4,4'-(N-(p-butylphenyl))diphenylamine)] (TFB), polyarylamine, poly(N-vinylcarbazole), poly(3,4-ethylenedioxythiophene (PEDOT), poly(3,4-ethylenedioxythiophene) polystyrene sulfonate, (PEDOT:PSS), polyaniline, polypyrrole, N,N,N', N'-tetrakis(4-methoxyphenyl)-benzidine (TPD), 4-bis[N-(1-naphthyl)-N-phenyl-amino]biphenyl (α-NPD), m-MT-DATA (4,4',4''-tris[phenyl(m-tolyl)amino]triphenylamine), 4,4',4''-tris(N-carbazolyl)-triphenylamine (TCTA), 1,1-bis [(di-4-toylamino)phenylcyclohexane (TAPC), p-type metal oxide (e.g., NiO, $WO_3$, $MoO_3$, etc.), carbon-based materials such as graphene oxide, or a combination thereof, but is not limited thereto.

The electron auxiliary layer 14 may include, for example, an electron injection layer, an electron transport layer, and/or a hole blocking layer, but is not limited thereto.

The electron auxiliary layer 14 may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), or a combination thereof, but is not limited thereto.

An embodiment may provide an electronic device including the aforementioned quantum dots, which may be used in various industry fields such as display, energy, semiconductor, bio, medical fields, and the like. In an embodiment, the electronic device including the aforementioned quantum dots may be applied in various fields such as a light emitting diode (LED), an organic light emitting diode (OLED), a sensor, a solar cell, an imaging sensor, a laser, lighting, medical equipment, a tag, or a device including a liquid crystal display (LCD).

In an embodiment, a quantum dot-light emitting diode (QD-LED) includes an organic/inorganic hybrid light emitting layer formed by filming a polymer and quantum dots thereinto, and efficiency of the QD-LED is largely determined by luminous efficiency of the light emitting layer (quantum dot layer). Factors affecting the luminous efficiency of the light emitting layer are quantum dots luminous efficiency (PLQY), further reduction in the efficiency due to energy transfer (ET) of the quantum dots, Auger recombination due to charge imbalance in the quantum dots, exciton separation according to an external electric voltage, and the like. Since the quantum dot light emitting diode (QD-LED) according to the present disclosure includes quantum dots having excellent luminous efficiency according to the embodiment, the light emitting layer exhibits excellent luminous efficiency, providing high quality.

In an embodiment, the preparing method may include separating the quantum dots form the manufactured reaction product. The separation of the quantum dots may further include separating the prepared quantum dots by using a reverse osmotic pressure filter or adding a non-solvent. Herein, the non-solvent may be a polar solvent mixed with a solvent in each step of the method but incapable of dispersing the quantum dots. The non-solvent may be, for example, acetone, ethanol, butanol, isopropanol, ethanediol, water, tetrahydrofuran, dimethylsulfoxide, diethylether, form aldehyde, acetaldehyde, or a combination thereof.

In an embodiment, the separation may be performed by employing centrifugation, precipitation, chromatography, or distillation. The separated semiconductor nanocrystals may be washed by being adding to a washing solvent, as needed. The washing solvent is not particularly limited but may include a solvent having a similar solubility parameter to that of the ligand, for example, hexane, heptane, octane, chloroform, toluene, benzene, and the like.

Hereinafter, the present disclosure is described in more detail through examples. These examples are only for illustrating the present disclosure, and it will be apparent to those of ordinary skill in the art that the scope of the present disclosure is not to be construed as being limited by these examples.

In the following comparative examples and examples, the surface-treated or surface-modified semiconductor nanocrystals are referred to as quantum dots.

Comparative Example 1: Synthesis of InP Semiconductor Nanocrystal

In a 50 ml 3-neck flask, 1.2 mmol of indium acetate $(In(OAc)_3)$ as an indium precursor and 3.6 mmol of oleic acid (OA) were loaded into 10 ml of an 1-ODE (1-octadecene) solvent, and the reaction mixture was heated at 105° C. for 1 hour under vacuum. A 0.2 M $(TMS)_3P$/TOP surface-modification solution was prepared by dissolving 100 mmol of tris(trimethylsilyl)phosphine $((TMS)_3P)$ in 500 ml of trioctylphosphine (TOP) as a phosphorus precursor. After heating the reaction flask loaded with the reaction mixture to 280° C., 3 ml of the prepared $(TMS)_3P$/TOP surface-modification solution was rapidly injected thereinto. The obtained mixture was maintained at 260° C. for 40 minutes, synthesizing InP semiconductor nanocrystals.

After cooling the reaction flask to room temperature by removing a heating mantle therefrom, the synthesized InP semiconductor nanocrystal solution was moved to a glove box filled with $N_2$ and then, twice purified with toluene and ethanol. The final InP semiconductor nanocrystals were diluted in 8 ml of toluene to prepare an InP semiconductor nanocrystal solution, which was stored in the glove box until further use.

Comparative Example 2: Synthesis of In(Zn)P Semiconductor Nanocrystal

In a 50 ml 3-neck flask, 1.2 mmol of indium acetate $(In(OAc)_3)$ as an indium precursor, 0.6 mmol of the prepared zinc acetate $(Zn(OAc)_2)$, and 4.8 mmol of oleic acid (OA) were loaded in 10 ml of an 1-ODE (1-octadecene) solvent, and the reaction mixture was degassed under vacuum at 105° C. for 1 hour. The reaction flask was heated to 240° C. for 1 hour 30 minutes to form In/Zn-oleic acid and then, cooled to 120° C. A 0.2 M $(TMS)_3P$/TOP surface-modification solution was prepared by dissolving 100 mmol of tris(trimethylsilyl)phosphine ($(TMS)_3P$) as a phosphorus precursor in 500 ml of trioctylphosphine (TOP). 4 ml of the $(TMS)_3P$/TOP surface-modification solution was rapidly injected into the reaction flask loaded with the reaction mixture. The obtained mixture was heated to 260° C. and maintained for 30 minutes, synthesizing In(Zn)P semiconductor nanocrystals.

After cooling the reaction flask to room temperature by removing a heating mantle, the synthesized solution was transferred to a glove box filled with $N_2$ and then, twice purified with toluene and ethanol. The final In(Zn)P semiconductor nanocrystals were diluted in 8 ml of toluene to prepare an In(Zn)P semiconductor nanocrystal solution, which was stored in a glove box unit for further use.

Comparative Example 3: TOP-Surface Treated InP Quantum Dot

An InP semiconductor nanocrystal solution was prepared in the same manner as in Comparative Example 1. Then, 1 ml of the prepared InP semiconductor nanocrystal solution was injected into 10 ml of 1-ODE degassed in a separate flask and then, degassed again at 80° C. to evaporate a solvent of the InP semiconductor nanocrystal solution. 0.5 ml of TOP (purity 97%) was injected thereto, and the flask was heated to 300° C. and maintained for 1 hour. The final TOP-surface-treated InP quantum dots were purified twice with toluene and ethanol and dissolved in toluene.

Comparative Example 4: Synthesis of Surface-Etched InP Quantum Dot

An InP semiconductor nanocrystal solution was prepared in the same manner as in Comparative Example 1. Then, 10 ml of 1-ODE and 2 mmol of zinc oleate $(Zn(OA)_2)$ were loaded into a separate 50 ml 3-neck flask and then, degassed at 100° C. for 30 minutes. 1 ml of the InP semiconductor nanocrystal solution prepared in the previous step was injected into the flask for 10 minutes to evaporate a solvent, preparing surface-etched InP quantum dots. The final surface-etched InP quantum dots were twice purified with toluene and ethanol and then, dissolved in toluene.

Comparative Example 5: Synthesis of Surface-Etched and TOP-Surface Treated InP Quantum Dot An InP semiconductor nanocrystal solution was prepared in the same manner as in Comparative Example 1. Then, 10 ml of 1-ODE and 2 mmol of zinc oleate $(Zn(OA)_2)$ were loaded into a separate 50 ml 3-neck flask and then, degassed at 100° C. for 30 minutes. 1 ml of the InP semiconductor nanocrystal solution prepared in the previous step was injected into the flask and then, degassed for 10 minutes to evaporate a solvent. Herein, 2 ml of TOP was injected into the flask and then, heated to 300° C. and maintained for 1 hour. The final surface-etched and TOP-surface-treated InP quantum dots were twice purified with toluene and ethanol and then, dissolved in toluene.

Comparative Example 6: Synthesis of $ZnCl_2$-Surface Treated InP Quantum Dot An InP semiconductor nanocrystal solution was prepared in the same manner as in Comparative Example 1. Then, 1 ml of the prepared InP semiconductor nanocrystal solution was injected into 10 ml of 1-ODE degassed in a separate flask and then, degassed again at 80° C. to evaporate a solvent of the InP semiconductor nanocrystal solution. Herein, 0.5 mmol of $ZnCl_2$ (purity of 99.99%) was injected into the flask and then, heated to 200° C. and maintained for 30 minutes. The final $ZnCl_2$-surface treated InP quantum dots were twice purified with toluene and ethanol and dissolved in toluene.

Comparative Example 7: Synthesis of TOP-Surface-Treated In(Zn)P Quantum Dot

An In(Zn)P semiconductor nanocrystal solution was prepared in the same manner as in Comparative Example 2. Subsequently, 1 ml of the prepared In(Zn)P semiconductor nanocrystal solution was injected into 10 ml of degassed 1-ODE in a separate flask and then, degassed again at 80° C. to evaporate a solvent of the In(Zn)P semiconductor nanocrystal solution. Herein, 0.5 ml of TOP (purity of 97%) was injected into the flask, and the flask was heated to 300° C. and maintained for 1 hour. The final TOP-surface treated In(Zn)P quantum dots were twice purified with toluene and ethanol and dissolved in toluene.

Comparative Example 8: Synthesis of Surface-Etched In(Zn)P Quantum Dot

An In(Zn)P semiconductor nanocrystal solution was prepared in the same manner as in Comparative Example 2. Then, 10 ml of 1-ODE and 2 mmol of zinc oleate $(Zn(OA)_2)$ were loaded into a separate 50 ml 3-neck flask and degassed at 100° C. for 30 minutes. 1 ml of the In(Zn)P semiconductor nanocrystal solution was injected into the flask and then, degassed for 10 minutes to remove a solvent, preparing surface-etched In(Zn)P quantum dots. The final surface-etched In(Zn)P quantum dots were twice purified with toluene and ethanol and dissolved in toluene.

Comparative Example 9: Synthesis of Surface-Etched and TOP-Surface-Treated In(Zn)P Quantum Dot An In(Zn)P semiconductor nanocrystal solution was prepared in the same manner as in Comparative Example 2. Then, 10 ml of 1-ODE and 2 mmol of zinc oleate $(Zn(OA)_2)$ were loaded into a separate 50 ml 3-neck flask and then, degassed at 100° C. for 30 minutes. 1 ml of the In(Zn)P semiconductor nanocrystal solution prepared in the previous step was put in the flask and degassed for 10 minutes to evaluate a solvent. Herein, 2 ml of TOP was injected thereinto, and the flask was heated to 300° C. and maintained for 1 hour. The final surface-etched and TOP-surface treated In(Zn)P quantum dots were twice purified with toluene and ethanol and dissolved in toluene.

Comparative Example 10: Synthesis of ZnCl$_2$-Surface Treated In(Zn)P Quantum Dot An InP semiconductor nanocrystal solution was prepared in the same method as in Comparative Example 2. Subsequently, 1 ml of the prepared In(Zn)P semiconductor nanocrystal solution was added to 10 ml of degassed 1-ODE in a separate flask and then, once more degassed at 80° C. to evaporate a solvent of the In(Zn)P semiconductor nanocrystal solution. Then, 0.5 mmol of ZnCl$_2$ (purity of 99.99%) was injected thereinto, and the flask was heated to 200° C. and maintained for 30 minutes. The final ZnCl$_2$-surface treated InP quantum dots were twice purified with toluene and ethanol and dissolved in toluene.

Comparative Example 11: Synthesis of InP/ZnSeS Core-Shell Quantum Dot

An InP semiconductor nanocrystal (core) solution having no surface-modification was prepared in the same manner as in Comparative Example 1. Subsequently, 0.3 ml of the 1 M TOP/Se precursor solution prepared by dissolving 10 mmol of Se in 10 ml of TOP was rapidly injected thereinto and then, heated up to 280° C. and maintained for 1 hour to grow a ZnSe shell. After 1 hour, the reaction flask was cooled to room temperature to complete a reaction. The final synthesized InP/ZnSeS core-shell quantum dots were twice purified with toluene and ethanol and dissolved in toluene.

Comparative Example 12: Synthesis of InP/ZnSe Core-Shell Quantum Dot

An InP semiconductor nanocrystal (core) solution having no surface-modification was prepared in the same manner as in Comparative Example 1. 1 ml of the InP semiconductor nanocrystal solution according to Comparative Example 1 was added to the zinc oleate-containing solution was added thereto and then, degassed for 10 minutes under a vacuum atmosphere. 0.3 ml of a 1 M TOP/Se precursor solution prepared by dissolving 10 mmol of Se in 10 ml of TOP was rapidly injected thereinto and then, heated to 280° C. and maintained for 1 hour to grow a ZnSe shell. After 1 hour, the reaction flask was cooled to room temperature to complete a reaction. The final synthesized InP/ZnSe core-shell quantum dots were twice purified with toluene and ethanol and then, dissolved in toluene.

Comparative Example 13: Synthesis of Surface-Etched In(Zn)P/ZnSeS Core-Shell Quantum Dot 2 mmol of zinc acetate and 4 mmol of oleic acid (OA) were added to 10 ml of ODE and then, degassed at about 105° C. for 1 hour, reacted at 250° C. for 30 minutes to prepare zinc oleate, and cooled to 80° C. 2 ml of the In(Zn)P semiconductor nanocrystal solution according to Comparative Example 2 was added to the zinc oleate-containing solution and then, degassed in a vacuum atmosphere for 10 minutes. After heating the flask to 200° C., 0.3 ml of a 1 M TOP/SeS precursor solution prepared by dissolving 5 mmol of Se and 5 mmol of S in 10 ml of TOP was rapidly injected thereinto and then, heated to 280° C. and maintained for 1 hour to grow a ZnSeS shell. After 1 hour, the reaction flask was cooled to room temperature to complete a reaction. The final synthesized In(Zn)P/ZnSeS core-shell quantum dots were twice purified with toluene and ethanol and dissolved in toluene.

Comparative Example 14: Synthesis of Surface-Etched In(Zn)P/ZnSe Core-Shell Quantum Dot 2 mmol of zinc acetate and 4 mmol of oleic acid (OA) were added to 10 ml of ODE and then, degassed at about 105° C. for 1 hour, reacted at 250° C. for 30 minutes to prepare zinc oleate, and cooled to 80° C. 2 ml of the In(Zn)P semiconductor nanocrystal solution according to Comparative Example 2 was added to the zinc oleate-containing solution and then, degassed under a vacuum atmosphere for 10 minutes. After heating the flask to 200° C., 10 mmol of Se was dissolved in 10 ml of TOP, and 0.3 ml of the prepared 1 M TOP/Se precursor solution was rapidly injected thereto and then, heated to 280° C. and maintained for 1 hour to grow a ZnSe shell. After 1 hour, the reaction flask was cooled to room temperature to complete a reaction. The synthesized In(Zn)P/ZnSe core-shell quantum dots were twice purified with toluene and ethanol and dissolved in toluene.

Comparative Example 15: Synthesis of Surface-Etched In(Zn)P/ZnSe/ZnS Core-Shell Quantum Dot 3 mmol of zinc acetate and 6 mmol of oleic acid (OA) were added to 10 ml of ODE and then, degassed at about 105° C. for 1 hour, reacted at 250° C. for 30 minutes to prepare zinc oleate, and cooled to 80° C. 2 ml of the In(Zn)P semiconductor nanocrystal solution according to Comparative Example 2 was added to the zinc oleate-containing solution and then, degassed in a vacuum atmosphere for 10 minutes. After heating the flask to 200° C., 10 mmol of Se was dissolved in 10 ml of TOP, and 0.3 ml of the prepared 1 M TOP/Se precursor solution was rapidly injected thereinto and then, heated to 280° C. and maintained for 30 minutes to grow a ZnSe shell. Subsequently, 0.3 ml of a 1 M TOP/S precursor solution prepared by dissolving 10 mmol of S in 10 ml of TOP was rapidly injected thereinto and then, heated up to 300° C. and maintained for 1 hour to grow a ZnS shell. After 1 hour, the reaction flask was cooled to room temperature to complete a reaction. The final synthesized In(Zn)P/ZnSe/ZnS core-shell quantum dots were twice purified with toluene and ethanol and dissolved in toluene.

Example 1: Synthesis of ZnCl$_2$/TOP(ZCT)-Surface Modified InP Quantum Dot

InP semiconductor nanocrystal solution was prepared in the same manner as in Comparative Example 1. Then, 1 ml of the prepared InP semiconductor nanocrystal solution was injected into 10 ml of degassed 1-ODE in a separate flask and then, degassed again at 80° C. to evaporate a solvent of the InP semiconductor nanocrystal solution.

10 mmol of ZnCl$_2$ was dissolved in 10 ml of TOP to prepare a 1 M ZnCl$_2$/TOP (hereinafter, referred to as "ZCT") surface-modification solution and then, stirred overnight on a hot plate at 100° C.

In a reaction flask loaded with the InP quantum dot solution, after putting 0.5 ml of the prepared ZCT surface-modification solution, the flask was heated to 240° C. and maintained for 30 minutes. The final ZCT-surface modified InP quantum dots were twice purified with toluene and ethanol and dissolved in toluene.

Example 2: Synthesis of ZCT-Surface Modified In(Zn)P Quantum Dot

An In(Zn)P semiconductor nanocrystal solution was prepared in the same manner as in Comparative Example 2. Subsequently, 1 ml of the prepared In(Zn)P semiconductor nanocrystal solution was added to 10 ml of degassed 1-ODE in a separate flask and then, once more degassed at 80° C. to evaporate a solvent of the In(Zn)P semiconductor nanocrystal solution.

A 1 M ZCT surface-modification solution was prepared by dissolving 10 mmol of $ZnCl_2$ in 10 ml of TOP and then, stirred overnight on a hot-plate heated to 100° C.

In a reaction flask loaded with the In(Zn)P quantum dot solution, after putting 0.5 ml of the prepared ZCT surface-modification solution, the flask was heated to 240° C. and maintained for 30 minutes. The final ZCT-surface modified In(Zn)P quantum dots were twice purified with toluene and ethanol and dissolved in toluene.

Example 3: Synthesis of Surface-Etched and ZCT-Surface-Modified InP Quantum Dot ml of 1-ODE and 2 mmol of zinc oleate (Zn OA)$_2$ were loaded in a 50 ml 3-neck flask and then, degassed at 100° C. for 30 minutes. Subsequently, 1 ml of the InP semiconductor nanocrystal solution according to Comparative Example 1 was injected thereinto and then, degassed for 10 minutes to evaporate a solvent, preparing a surface-etched InP quantum dot solution.

A 1 M ZCT surface-modification solution was prepared by dissolving 10 mmol of $ZnCl_2$ in 10 ml of TOP and then, stirred overnight on a hot-plate heated to 100° C.

In a reaction flask loaded with the surface-etched InP quantum dot solution, after putting 0.5 ml of the prepared ZCT surface-modification solution, the flask was heated to 300° C. and maintained for 60 minutes. The final surface-etched and ZCT-surface-modified InP(InP—Zn(OA)$_2$-ZCT) quantum dots were twice purified with toluene and ethanol and dissolved in toluene.

Example 4: Synthesis of Surface-Etched and ZCT-Surface-Modified In(Zn)P Quantum Dot ml of 1-ODE and 2 mmol of zinc oleate (Zn OA)$_2$ were loaded in a 50 ml 3-neck flask and then, degassed at 100° C. for 30 minutes. Subsequently, 1 ml of the In(Zn)P semiconductor nanocrystal solution according to Comparative Example 2 was added thereto and then, degassed for 10 minutes to evaporate a solvent, preparing a surface-etched In(Zn)P semiconductor nanocrystal solution.

An 1 M ZCT surface-modification solution was prepared by dissolving 10 mmol of $ZnCl_2$ in 10 ml of TOP and then, stirred overnight on a hot-plate heated to 100° C.

0.5 ml of the prepared ZCT surface-modification solution was added to the reaction flask loaded with the surface-etched In(Zn)P quantum dot solution and then, heated to 300° C. and maintained for 60 minutes. The final surface-etched and ZCT-surface-modified In(Zn)P(In(Zn)P—Zn(OA)$_2$-ZCT) quantum dots were twice purified with toluene and ethanol and dissolved in toluene.

Example 5: Synthesis of Surface-Etched and ZCT-Surface-Modified InP/ZnSe Core-Shell Quantum Dot A 1 M ZCT surface-modification solution was prepared by dissolving 10 mmol of $ZnCl_2$ in 10 ml of TOP and then, stirred overnight on a hot-plate heated to 100° C.

After filling $N_2$ gas in a flask loaded with the InP semiconductor nanocrystal solution and Zn(OA)$_2$ according to Comparative Example 1, 0.5 ml of the ZCT surface-modification solution was injected thereinto and then, degassed at 80° C. for 10 minutes to remove a solvent.

After heating the flask to 200° C., 0.2 ml of an 1 M TOP/Se precursor solution prepared by dissolving 10 mmol of Se in 10 ml of TOP was added thereto and then, heated to 280° C. and maintained for 1 hour to grow a ZnSe shell. After 1 hour, the reaction flask was cooled to room temperature to complete a reaction. The final synthesized InP (InP—Zn (OA)$_2$-ZCT)/ZnSe core-shell quantum dots were twice purified with toluene and ethanol and dissolved in toluene.

Example 6: Synthesis of Surface-Etched and ZCT-Surface-Modified InP/ZnSeS Core-Shell Quantum Dot A 1 M ZCT surface-modification solution was prepared by dissolving 10 mmol of $ZnCl_2$ in 10 ml of TOP, and then stirred overnight on a hot-plate heated to 100° C.

After filling $N_2$ gas in a flask loaded with the InP semiconductor nanocrystal solution and Zn(OA)$_2$ according to Comparative Example 1, 0.5 ml of the ZCT surface-modification solution was injected thereinto and then, degassed at 80° C. for 10 minutes to remove a solvent.

After heating the flask to 200° C., 0.3 ml of an 1 M TOP/(Se+S) precursor solution prepared by dissolving 5 mmol of Se and 5 mmol of S in 10 ml of TOP was rapidly injected thereinto and then, heated to 280° C. and maintained for 1 hour to grow a ZnSeS shell. After 1 hour, the reaction flask was cooled to room temperature to complete a reaction. The final synthesized InP(InP—Zn (OA)$_2$-ZCT)/ZnSeS core-shell quantum dots were twice purified with toluene and ethanol and dissolved in toluene.

Example 7: Synthesis of Surface-Etched and ZCT-Surface-Modified InP/ZnS Core-Shell Quantum Dot A 1 M ZCT surface-modification solution was prepared by dissolving 10 mmol of $ZnCl_2$ in 10 ml of TOP and then stirring it overnight on a hot-plate heated to 100° C.

After filling $N_2$ gas in a flask loaded with the InP semiconductor nanocrystal solution and Zn(OA)$_2$ according to Comparative Example 1, 0.5 ml of the ZCT surface-modification solution was injected thereinto, and then degassed at 80° C. for 10 minutes to remove a solvent.

After heating the flask to 200° C., 0.5 ml of an 1 M TOP/S precursor solution prepared by dissolving 10 mmol of S in 10 ml of TOP was rapidly injected thereinto and then, heated to 280° C. and maintained for 1 hour to grow a ZnS shell. After 1 hour, the reaction flask was cooled to room temperature to complete a reaction. The final synthesized InP (InP—Zn (OA)$_2$-ZCT)/ZnS core-shell quantum dots were twice purified with toluene and ethanol and dissolved in toluene.

Example 8: Synthesis of Surface-Etched and ZCT-Surface-Modified In(Zn)P/ZnSe Core-Shell Quantum Dot A 1 M ZCT surface-modification solution was prepared by dissolving 10 mmol of $ZnCl_2$ in 10 ml of TOP and then stirring it overnight on a hot-plate heated to 100° C. After filling $N_2$ gas in a flask loaded with the In(Zn)P semiconductor nanocrystal solution and $Zn(OA)_2$ according to Comparative Example 2, 0.5 ml of the ZCT surface-modification solution was injected thereinto and then, degassed at 80° C. for 10 minutes to remove a solvent. After heating the flask to 200° C., 0.3 ml of an 1 M TOP/Se precursor solution prepared by dissolving 10 mmol of Se in 10 ml of TOP was injected thereinto and then, heated to 280° C. and maintained for 1 hour to grow a ZnSe shell. After 1 hour, the reaction flask was cooled to room temperature to complete the reaction. The final synthesized In(Zn)P(In(Zn)P—Zn $(OA)_2$-ZCT)/ZnSe core-shell quantum dots were twice purified with toluene and ethanol and then, dissolved in toluene.

Example 9: Synthesis of Surface-Etched and ZCT-Surface-Modified In(Zn)P/ZnSeS Core-Shell Quantum Dot A 1 M ZCT surface-modification solution was prepared by dissolving 10 mmol of $ZnCl_2$ in 10 ml of TOP and then stirring it overnight on a hot-plate heated to 100° C.

After filling $N_2$ gas in a flask loaded with the InP semiconductor nanocrystal solution and $Zn(OA)_2$ according to Comparative Example 1, 0.5 ml of the ZCT surface-modification solution was injected thereinto and then, degassed at 80° C. for 10 minutes to remove a solvent.

After heating the flask to 200° C., 0.2 ml of an 1 M TOP/Se precursor solution prepared by dissolving 10 mmol of Se in 10 ml of TOP was injected thereinto and then, heated to 280° C. and maintained for 1 hour, and 0.3 ml of an 1 M TOP/(Se+S) precursor solution prepared by dissolving 5 mmol of Se and 5 mmol of S in 10 ml of TOP was rapidly injected thereinto and then, heated to 280° C. and maintained for 1 hour to grow a ZnSeS shell. After 1 hour, the reaction flask was cooled to room temperature to complete the reaction. The final synthesized In(Zn)P(In(Zn)P—Zn $(OA)_2$-ZCT)/ZnSeS core-shell quantum dots were twice purified with toluene and ethanol and dissolved in toluene.

Example 10: Synthesis of Surface-Etched and ZCT-Surface-Modified In(Zn)P/ZnSe/ZnS Core-Shell Quantum Dot A 1 M ZCT surface-modification solution was prepared by dissolving 10 mmol of $ZnCl_2$ in 10 ml of TOP and then stirring it overnight on a hot-plate heated to 100° C. After filling $N_2$ gas in a flask loaded with the In(Zn)P semiconductor nanocrystal solution and $Zn(OA)_2$ according to Comparative Example 2, 0.5 ml of the ZCT surface-modification solution was injected thereinto and then, degassed at 80° C. for 10 minutes to remove solvent. After heating the flask to 200° C., 0.3 ml of an 1 M TOP/Se precursor solution prepared by dissolving 10 mmol of Se in 10 ml of TOP was rapidly injected thereinto and then heated to 280° C. and maintained for 1 hour to grow a ZnSe shell. Subsequently, 0.3 ml of a 1 M TOP/S precursor solution prepared by dissolving 10 mmol of S in 10 ml of TOP was rapidly injected thereinto and then heated to 300° C. for 1 hour to grow a ZnS shell. After 1 hour, the reaction flask was cooled to room temperature to complete a reaction. The final synthesized In(Zn)P(In(Zn)P—Zn $(OA)_2$-ZCT)/ZnSe/ZnS-ZCT core-shell quantum dots were twice purified with toluene and ethanol and dissolved in toluene.

LED Manufacturing Including Quantum Dots According to Comparative Examples and Examples First, a glass substrate coated with ITO as a positive electrode was ultrasonically cleaned in an acetone and isopropylalcohol solution, dried by using nitrogen, and UV-ozone-treated for 15 minutes. A PEDOT:PSS (poly (ethylenedioxythiophene): polystytene sulfonate) solution was spin-coated thereon at 5000 rpm and heated at 120° C. on a hot plate for 5 minutes. The coated substrate was transferred to a glove box under a nitrogen atmosphere and heated on a 210° C. hot plate for 15 minutes to remove oxygen and moisture, forming a hole injection layer (HIL). A solution of TFB (poly[(9,9-dioctylfluorenyl-2,7-diyl)-co-(4,4'-(N-(p-butylphenyl))diphenylamine)]) diluted to 8 mg/ml in chlorobenzene was spin-coated at 3000 rpm and then, heat-treated at 180° C. for 30 minutes, forming a hole transport layer (HTL). Subsequently, the quantum dots of the comparative examples and the examples were diluted at a concentration of 30 mg/ml in octane and then, spin-coated at 2000 rpm and heat-treated for 30 minutes, forming a light emitting layer. ZnMgO nanoparticles diluted at a concentration of 30 mg/ml in ethanol were spin-coated thereon at 3000 rpm and then, heat-treated at 100° C. for 30 minutes, forming an electron transport layer (ETL). Subsequently, an aluminum electrode was deposited thereon to form a cathode, fabricating a light emitting diode (LED). LED had a structure of ITO/PEDOT:PSS/TFB/InP quantum dot/ ZnMgO nanoparticle/Al.

Figure 3A:
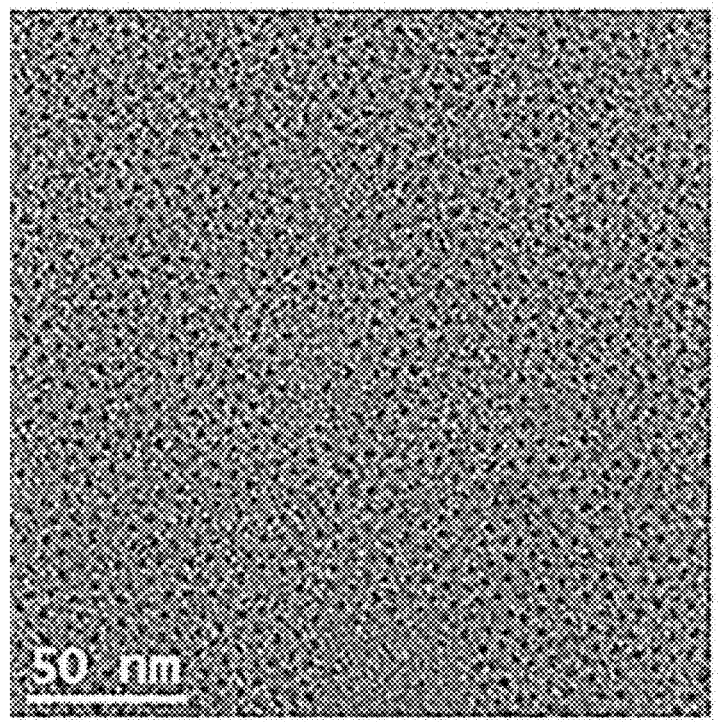
FIG. 3A is a transmission electron micrograph (TEM) image of the InP semiconductor nanocrystal particles prepared in Comparative Example 1 taken with JEOL's JEM-2010.
Figure 3B:
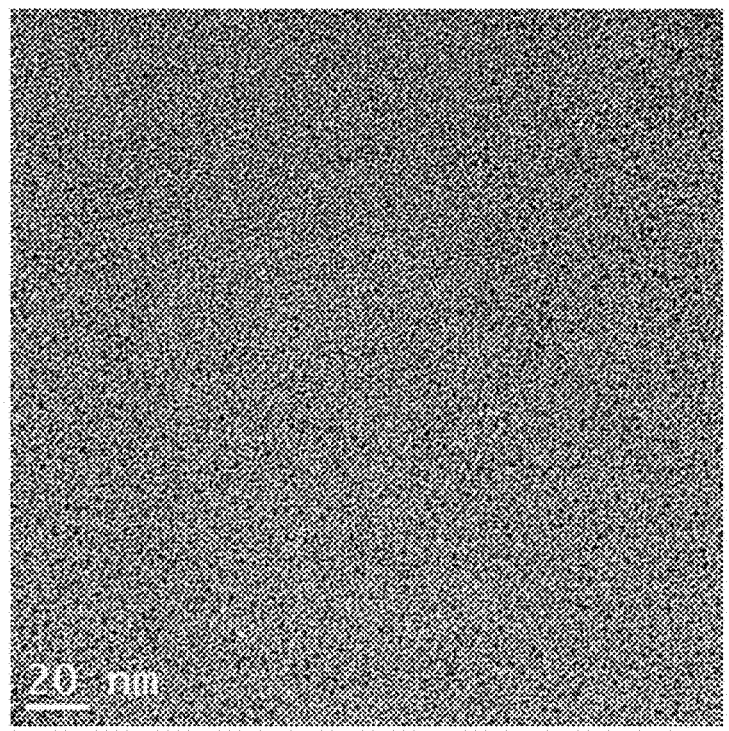
FIG. 3B is a TEM image of the In(Zn)P core particles prepared in Comparative Example 2 taken with JEOL's JEM-2010.
Figure 3C:
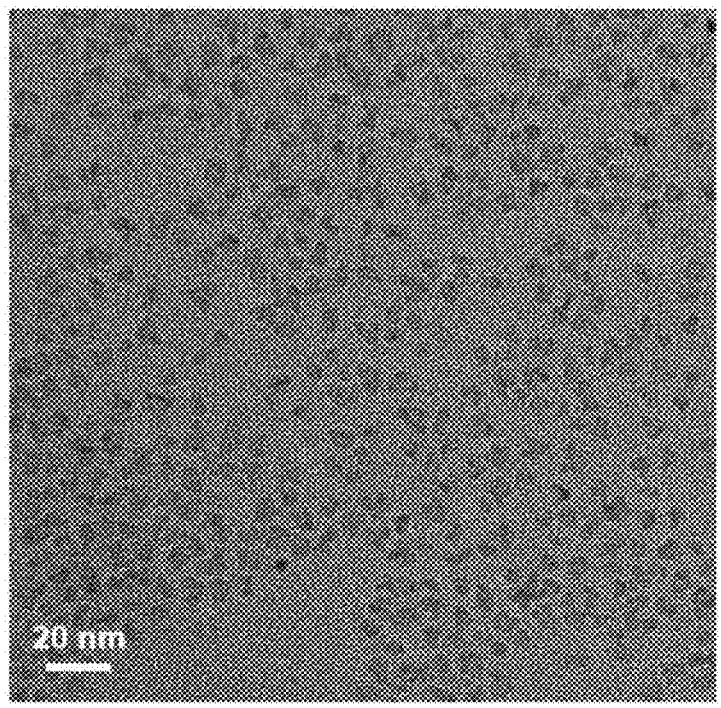
FIG. 3C is a TEM image of In(Zn)P/ZnSeS core-shell quantum dot particles according to Example 9 taken with JEOL's JEM-2010.

Evaluation Example 1: Transmission Electron Micrograph (TEM) Image of Quantum Dots The InP semiconductor nanocrystal solution according to Comparative Example 1, the In(Zn)P semiconductor nanocrystal solution according to Comparative Example 2, and the In(Zn)P/ZnSeS core-shell quantum dot solution according to Example 9 were drop cast on a TEM grid, dried, and then, analyzed with TEM photographs (JEM-2010, JEOL, Ltd.). The results are respectively shown in FIGS. 3A, 3B, and 3C. FIG. 3A is a transmission electron micrograph (TEM) image of the InP semiconductor nanocrystal particles prepared in Comparative Examples 1 and 2 and Example 9. Referring to FIGS. 3A, 3B, and 3C, the semiconductor nanocrystals according to Comparative Examples 1 and 2 and Example 9 were synthesized in a nanosize.

Evaluation Example 2: Confirmation of the Formation of a Ligand Complex

Figure 4:
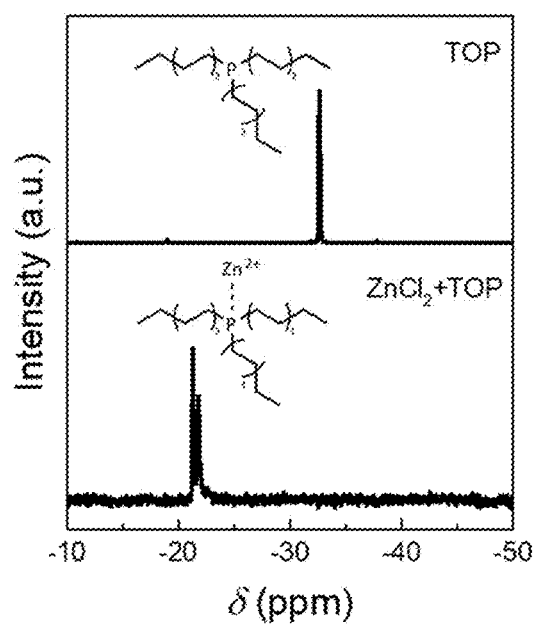
FIG. 4 is a view showing the NMR analysis results of the $ZnCl_2$/TOP (ZCT) surface-modification solution prepared in Example 3 and TOP.

The ZCT surface-modification solution according to Example 3 was analyzed through NMR (Resonance frequency: 400 MHz, Spectrometer: Advance III 400 MHz FT NMR, Bruker, Solvent: d-chloroform), and the results are shown in FIG. 4. For comparison, NMR of TOP is also shown in FIG. 4. FIG. 4 is a view showing the NMR analysis results of the $ZnCl_2$/TOP (ZCT) surface-modification solution prepared in Example 3 and TOP. As shown in FIG. 4, the surface-modification solution of Example 3 exhibited that a different ZCT ligand complex from that of TOP was formed.

Figure 5:
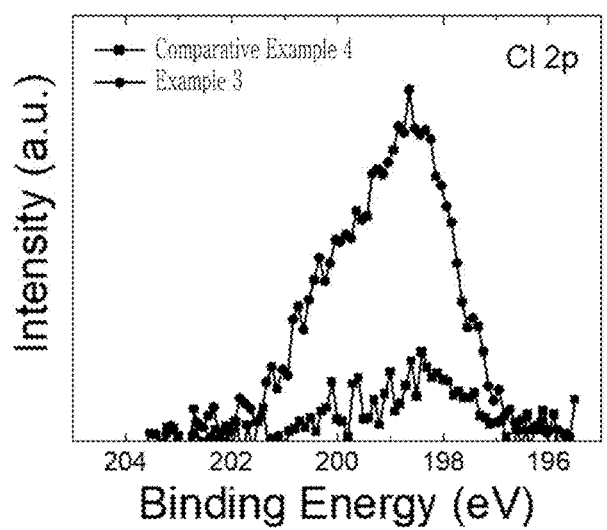
FIG. 5 is a graph showing the X-ray photoelectron spectroscopy (XPS) analysis results of the surface-modified quantum dots according to Example 3 and the surface-etched quantum dots according to Comparative Example 4.

In order to confirm the formation of the ligand complex of the surface-modified quantum dots according to Example 3, the surface-modified quantum dots according to Example 3 and the semiconductor nanocrystals according to Comparative Example 1 were XPS-analyzed (K-alpha Plus, Thermo Fisher Scientific), and the results are shown in FIG. 5. FIG. 5 is a graph showing the X-ray photoelectron spectroscopy (XPS) analysis results of the surface-modified quantum dots according to Example 3 and the surface-etched quantum dots according to Comparative Example 4. Referring to FIG. 5, the ligand complex of surface-modified quantum dots according to Example 3 turned out to be a different product from the surface treatment material.

Evaluation Example 3: Surface Analysis of Surface-Modified Quantum Dots

Figure 6:
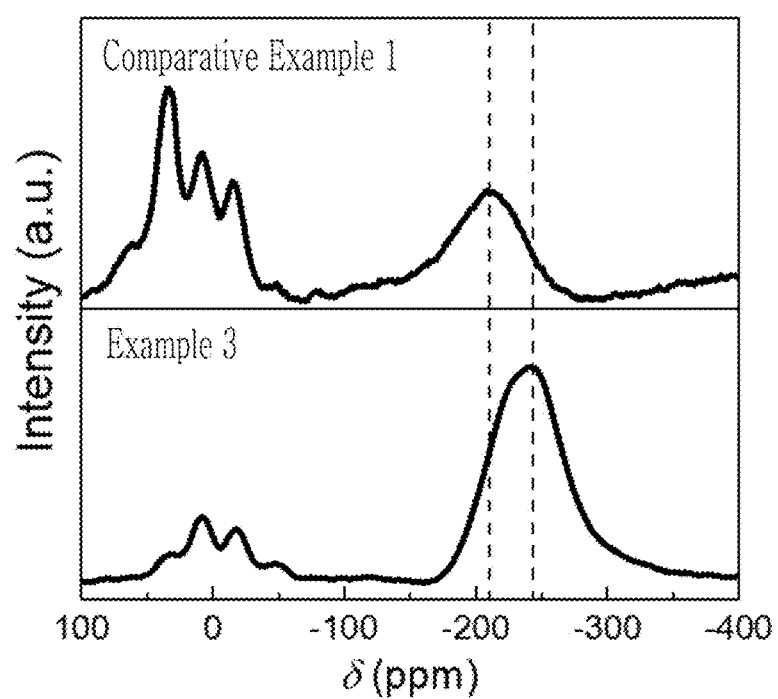
FIG. 6 is a graph showing the results of $^1H$-$^{31}P$ CP MAS (Cross-polarization Magic Angle Spinning) solid state NMR analysis of the surface-modified quantum dots according to Example 3 and the semiconductor nanocrystals according to Comparative Example 1.

The surface-modified quantum dots (InP—Zn(OA)$_2$-ZCT) according to Example 3 and the semiconductor nanocrystals (Bare InP core) according to Comparative Example 1 were analyzed with respect to $^1$H-$^{31}$P Cross-polarization Magic Angle Spinning (CP MAS) solid state NMR (spinning speed: 5 kHz, resonance frequency: 400 Mhz, Varian 400 MHz NMR, Agilent), and the results are shown in FIG. 6. FIG. 6 is a graph showing the $^1$H-$^{31}$P CP MAS (Cross-polarization Magic Angle Spinning) solid state NMR analysis results of the surface-modified quantum dots according to Example 3 and the semiconductor nanocrystals according to Comparative Example 1. In FIG. 6, a peak near −210 ppm means a binding signal of In—P, a peak near −240 ppm means a binding signal of a ligand complex (surface modifying material) with semiconductor nanocrystals (InP), and a peak near 0 ppm (−50 ppm to 50 ppm) means an oxide signal. Referring to FIG. 6, the surface-modified quantum dots according to Example 3 exhibited 64% or more reduced oxide peak, compared with the semiconductor nanocrystals according to Comparative Example 1 (an area of the oxide peak of Example 3 was reduced to 36% based on 100% of an area of that of Comparative Example 1), and in addition, a peak of the surface modifying material shifted by 20 ppm toward the right, which shows that the surface modifying material turned out to be different from the bare quantum dots.

Figure 7A:
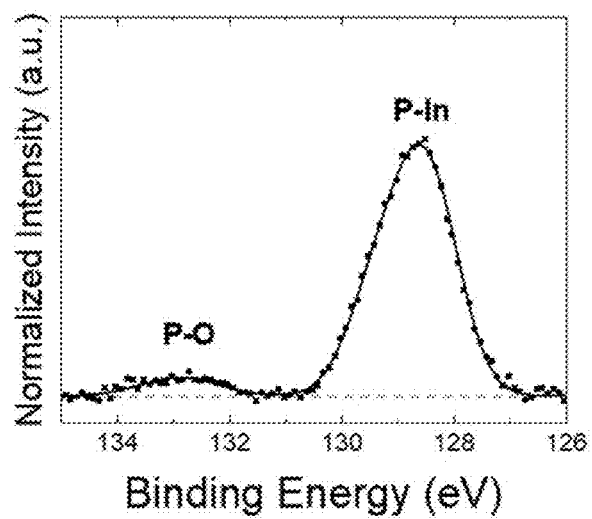
FIG. 7A is a view showing XPS analysis results of semiconductor nanocrystals according to Comparative Example 1 (bare InP).
Figure 7B:
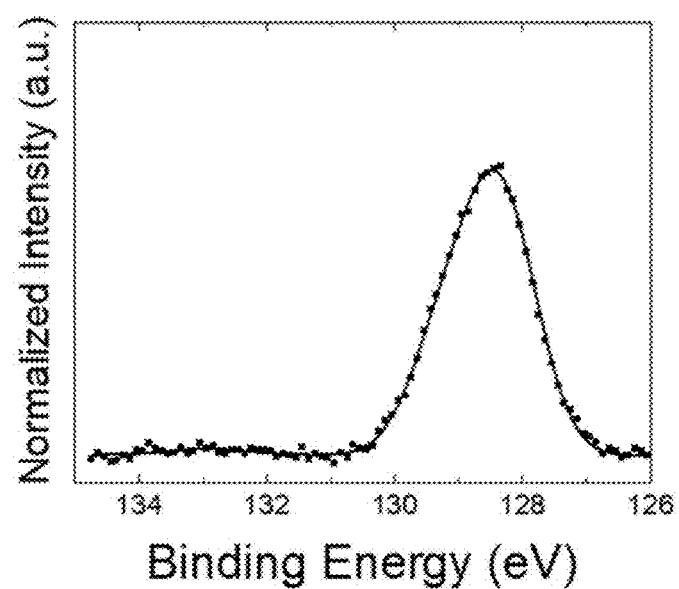
FIG. 7B is a view showing XPS analysis results of quantum dots according to Example 3 (surface-etched and ZCT-surface-modified InP).

In order to check an oxide reduction effect of the surface-modified quantum dots, the quantum dots of Comparative Example 1 (bare InP) and Example 3 (surface-etched and ZCT-surface-modified InP) were measured with respect to XPS, and the results are shown in FIGS. 7A and 7B. FIG. 7A is a view showing the XPS analysis result of the semiconductor nanocrystals according to Comparative Example 1 (bare InP), and FIG. 7B is a view showing the XPS analysis result of the quantum dots according to Example 3 (surface-etched and ZCT-surface-modified InP). In FIGS. 7A and 7B, a peak at 132 eV to 134 eV indicates an oxide peak, and a peak at 126 eV to 130 eV indicates a peak of InP. Referring to FIGS. 7A and 7B, the quantum dots according to Example 3 exhibited 50% or more reduced oxide peak, compared with the quantum dots according to Comparative Example 1 (an area of the oxide peak of Example 3 was reduced to 50% based on 100% of an area of the oxide peak of Comparative Example 1).

Figure 8A:
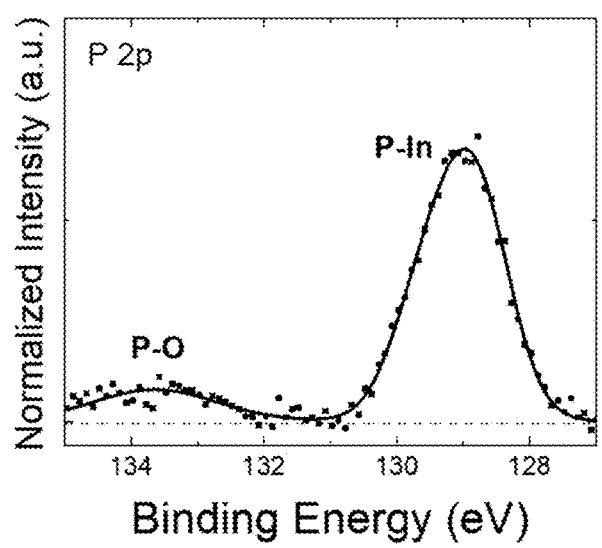
FIG. 8A is a view showing XPS analysis results of quantum dots according to Comparative Example 14 (surface-etched In(Zn)P core/ZnSe shell).
Figure 8B:
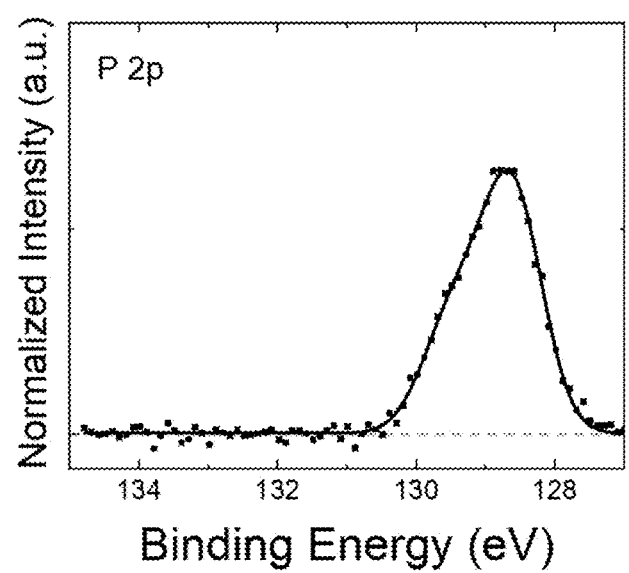
FIG. 8B is a view showing XPS analysis results of quantum dots according to Example 8 (surface-etched and ZCT-surface-modified In(Zn)P).

In order to check an oxide reduction effect of quantum dots with a core-shell structure, XPS of the quantum dots according to Comparative Example 14 (surface-etched In(Zn)P core/ZnSe shell) and Example 8 (surface-etched and ZCT-surface-modified In(Zn)P/ZnSe) was measured, and the results are shown in FIGS. 8A and 8B. FIG. 8A is a view showing the XPS analysis result of the quantum dots according to Comparative Example 14 (surface-etched In(Zn)P core/ZnSe shell), and FIG. 8B is a view showing the XPS analysis result of the quantum dots according to Example 8 (surface-etched and ZCT-surface-modified In(Zn)P). In FIGS. 8A and 8B, a peak at 132 eV to 134 eV indicates an oxide (P—C) peak, and a peak at 128 eV to 130 eV indicates a P—In bond peak. Referring to FIGS. 8A and 8B, the quantum dots according to Example 8 exhibited 90% or more reduced oxide peak (an area of the oxide peak of Example 8 was reduced to 10% based on 100% of an area of the oxide peak of Comparative Example 14).

Evaluation Example 4: Optical Properties of Quantum Dots

The semiconductor nanocrystals (quantum dots) according to the comparative examples and the examples were analyzed with respect to UV-Vis absorption (absorbance) spectra and photoluminescence (PL intensity) spectra by diluting the synthesized semiconductor nanocrystals (quantum dots) respectively in hexane and loading them into a cuvette.

The UV-Vis absorption spectra of the semiconductor nanocrystals were analyzed by using Shimadzu UV-2600 (Shimadzu Corp.). The photoluminescence spectra of the semiconductor nanocrystals were analyzed by using Fluoromax-4 (Horiba).

Figure 9A:
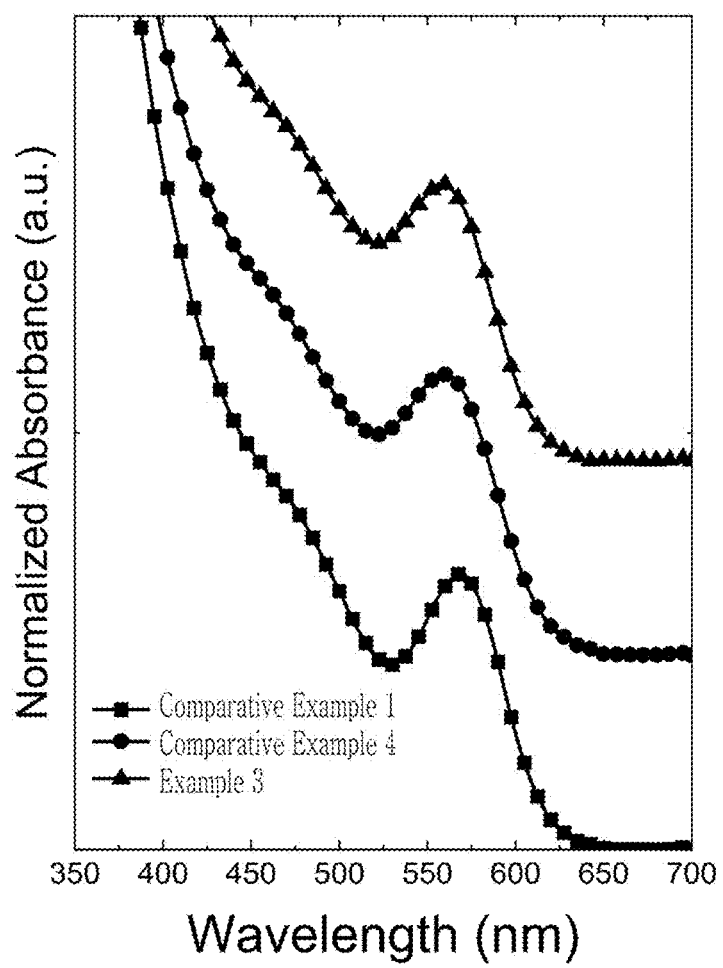
FIG. 9A is a graph showing the UV-Vis absorption spectra of the non-surface-modified InP semiconductor nanocrystals (Comparative Example 1), the surface-etched InP semiconductor nanocrystals (Comparative Example 4, InP—Zn(OA)$_2$), and the surface-modified InP semiconductor nanocrystals (Example 3, (InP—Zn(OA)$_2$-ZCT).
Figure 9B:
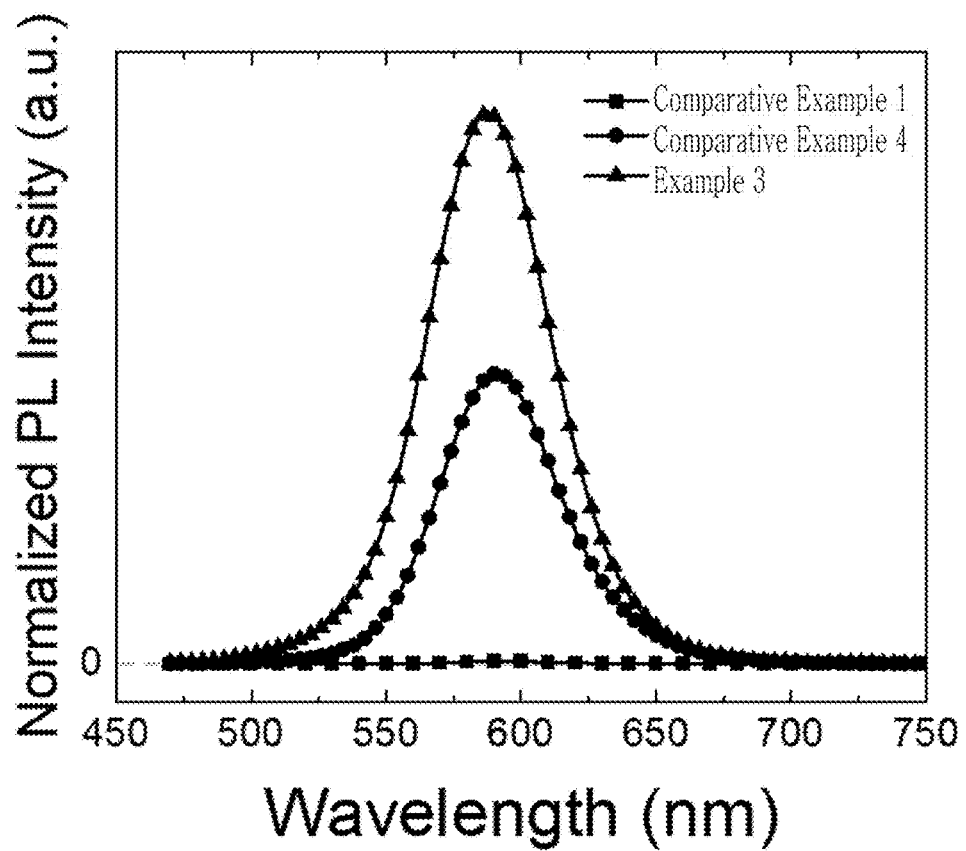
FIG. 9B is a graph showing photoluminescence (PL intensity) spectra of the InP semiconductor nanocrystals (Comparative Example 1), the surface-etched InP semiconductor nanocrystals (Comparative Example 4, InP—Zn(OA)$_2$), and the surface-modified InP semiconductor nanocrystals of Example 3 (InP—Zn(OA)$_2$-ZCT).

The UV-Vis absorption spectra and photoluminescence (PL intensity) spectra of the non-surface-modified InP semiconductor nanocrystals (Comparative Example 1), the surface-etched InP ((InP—Zn(OA)$_2$, Comparative Example 4), and the surface-modified InP semiconductor nanocrystals (InP—Zn (OA)$_2$-ZCT, Example 3) are respectively shown in FIGS. 9A and 9B. FIG. 9A is a graph showing the UV-Vis absorption spectra of the semiconductor nanocrystals according to Comparative Example 1, Comparative Example 4, and Example 3, and FIG. 9B is a graph showing photoluminescence (PL intensity) spectra of the semiconductor nanocrystals according to Comparative Example 1, Comparative Example 4, and Example 3.

As shown in FIG. 9A, the semiconductor nanocrystals according to Comparative Example 1, Comparative Example 4, and Example 3 exhibited similar light efficiency but significant difference in photoluminescence efficiency depending on a surface treatment, as shown in FIG. 9B. Specifically, Comparative Example 1 without surface treatment exhibited no photoluminescence spectrum, but the surface-modified quantum dots of Example 3 exhibited improved photoluminescence efficiency, compared with those of Comparative Example 4.

Figure 10A:
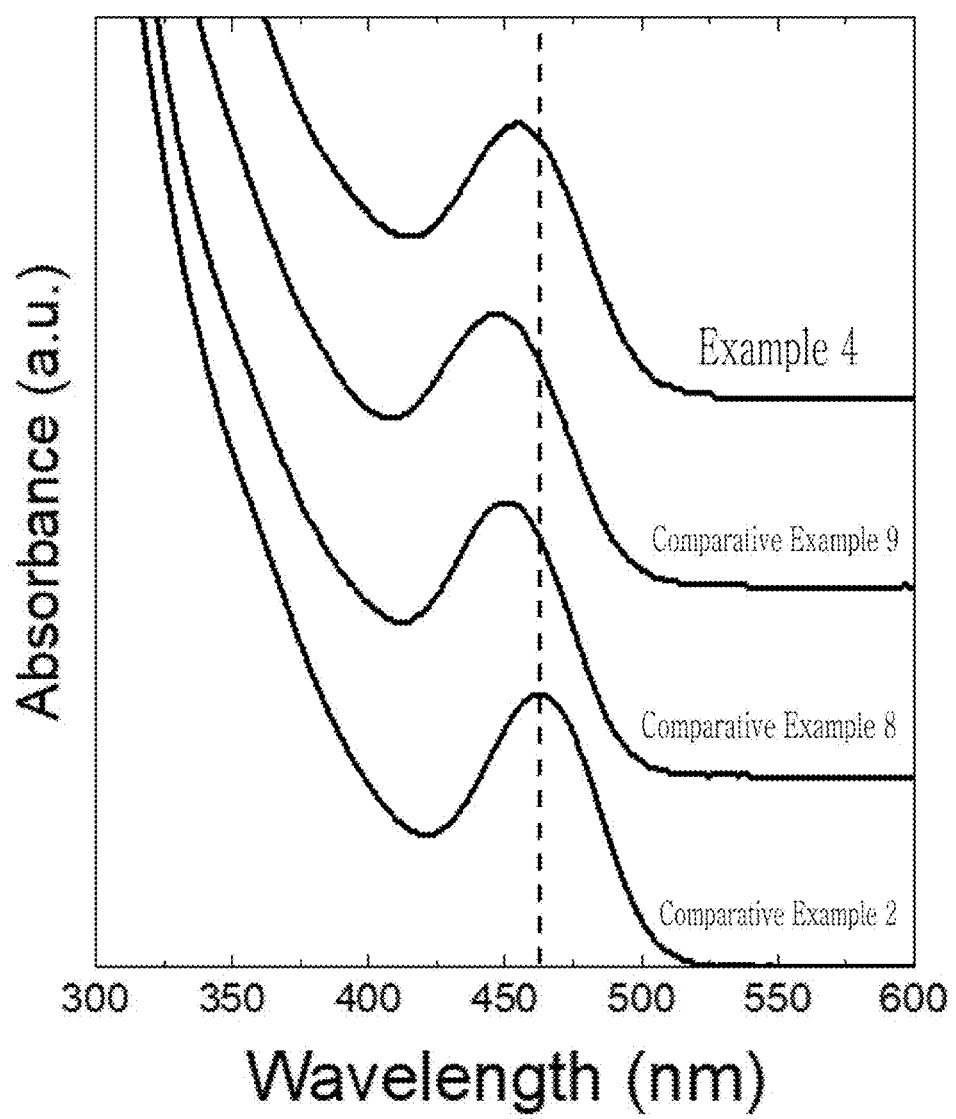
FIG. 10A is a graph showing UV-Vis absorption spectra of the non-surface-modified In(Zn)P of Comparative Example 2, the surface-etched In(Zn)P of Comparative Example 8, the surface-etched and TOP-surface-treated In(Zn)P (In(Zn)P—Zn(OA)$_2$-TOP) of Comparative Example 9, and the surface-modified In(Zn)P (In(Zn)P—Zn(OA)$_2$-ZCT) of Example 4.
Figure 10B:
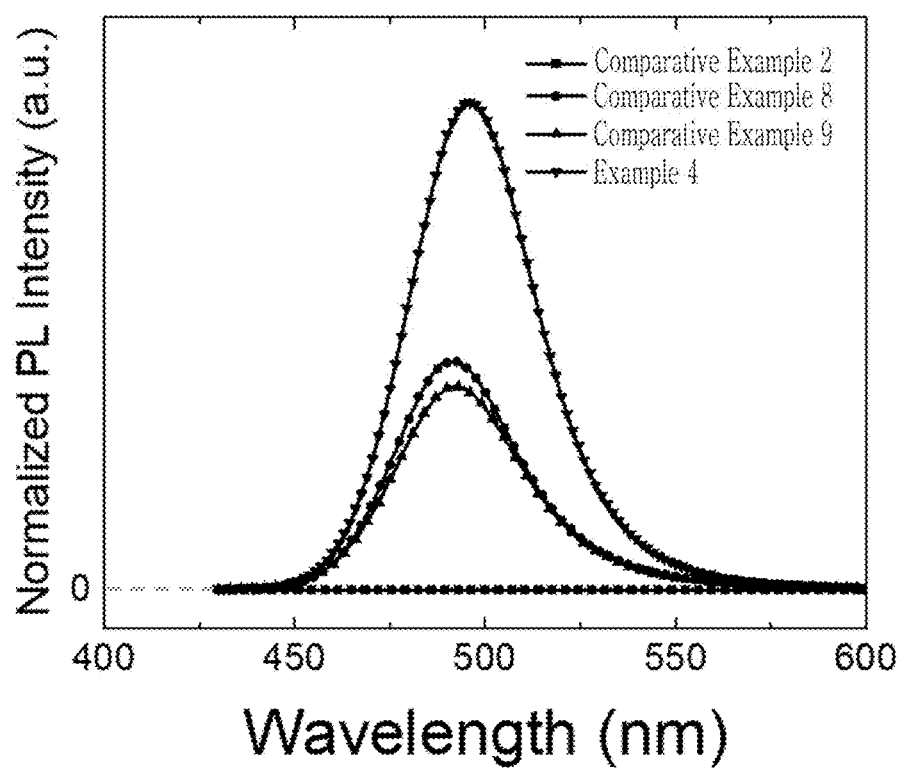
FIG. 10B shows a graph showing PL intensity spectra of the non-surface-modified In(Zn)P of Comparative Example 2, the surface-etched In(Zn)P of Comparative Example 8, the surface-etched and TOP-surface-treated In(Zn)P (In(Zn)P—Zn(OA)$_2$-TOP) of Comparative Example 9, and the surface-modified In(Zn)P (In(Zn)P—Zn(OA)$_2$-ZCT) of Example 4.

On the other hand, the UV-Vis absorbance spectra and photoluminescence (PL intensity) spectra of non-surface-modified In(Zn)P (Comparative Example 2), surface-etched In(Zn)P (Comparative Example 8), surface-etched and TOP-surface treated In(Zn)P (Comparative Example 9, In(Zn)P—Zn(OA)$_2$-TOP), and surface modified In(Zn)P (Example 4, In(Zn)P—Zn (OA)$_2$-ZCT) are shown in FIGS. 10A and 10B. FIG. 10A is a graph showing the UV-Vis absorption spectra of the quantum dots according to Comparative Examples 2, 8, and 9 and Example 4, and FIG. 10B shows a graph showing the photoluminescence (PL intensity) spectra of the quantum dots according to Comparative Examples 2, 8, and 9 and Example 4.

Referring to FIGS. 10A and 10B, compared with the quantum dots according to Comparative Examples 2, 8, and 9, the quantum dots according to Example 4 exhibited significantly improved light absorption efficiency and photoluminescence efficiency.

Figure 11:
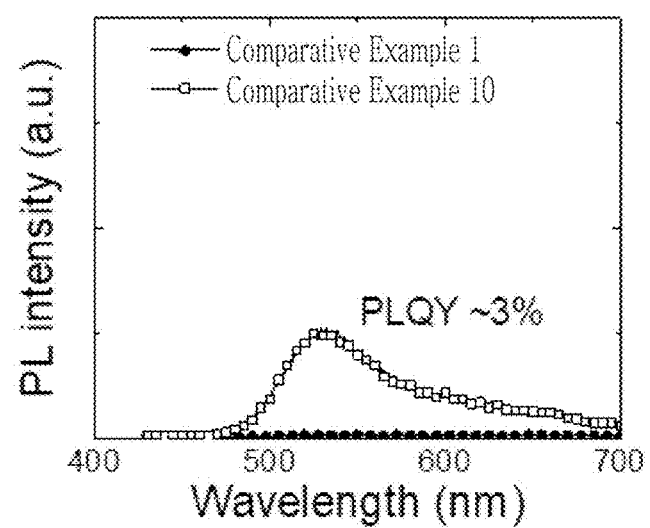
FIG. 11 is a graph showing the photoluminescence efficiency of the semiconductor nanocrystals according to Comparative Example 1 and the surface-treated quantum dots according to Comparative Example 10.

FIG. 11 is a graph showing the photoluminescence efficiency of the semiconductor nanocrystals according to Comparative Example 1 and the surface-treated quantum dots according to Comparative Example 10. Referring to FIG. 11, the surface-treated quantum dots according to Comparative Example 10 exhibited excellent photoluminescence efficiency, compared with the semiconductor nanocrystals according to Comparative Example 1, but the traps were not completely removed at 600 nm or more.

Figure 12:
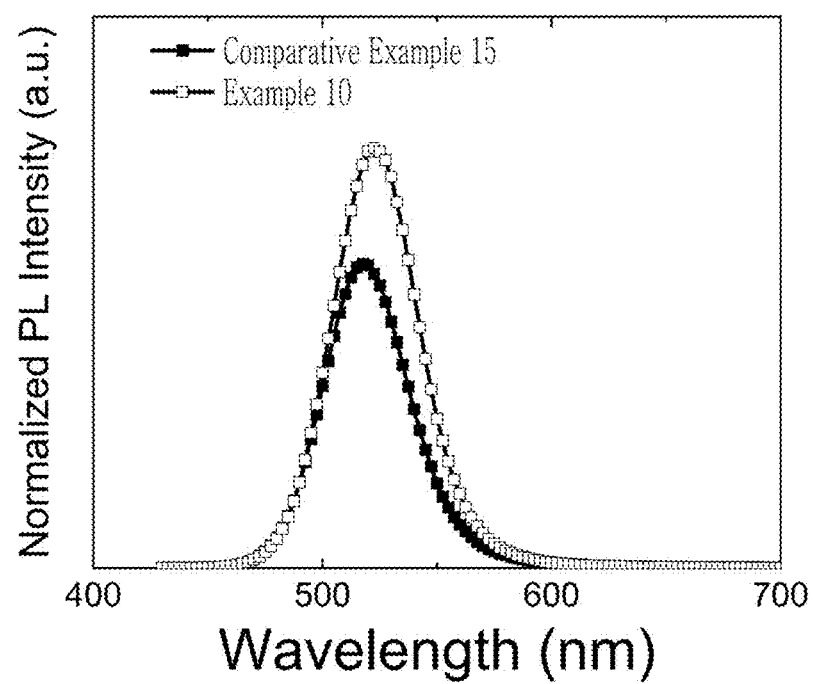
FIG. 12 is a graph showing UV-Vis absorption spectra and PL intensity spectra of the quantum dots (In(Zn)P—Zn(OA)$_2$/ZnSe/ZnS) having a core-shell structure according to Comparative Example 15 and the quantum dots (In(Zn)P-ZCT/ZnSe/ZnS) having a core-shell structure and including the core surface-modified with ZCT according to Example 10.

FIG. 12 is a graph showing UV-Vis absorption spectra and PL intensity spectra of the quantum dots (In(Zn)P—Zn(OA)$_2$/ZnSe/ZnS) having a core-shell structure according to Comparative Example 15 and the quantum dots having a core-shell structure and including the core surface-modified with ZCT according to Example 10 (In(Zn)P-ZCT/ZnSe/ZnS).

As shown in FIG. 12, Example 10, compared with Comparative Example 15, exhibited about 32% or more increased photoluminescence efficiency due to the surface treatment of the core.

Evaluation Example 5: Photoluminescence Quantum Yield of Quantum Dots

Figure 13:
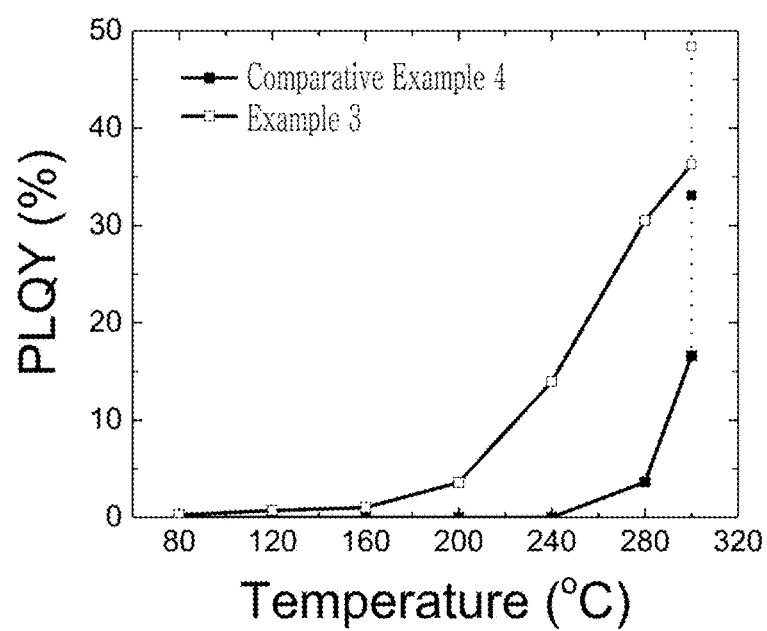
FIG. 13 shows results of comparing the photoluminescence efficiency (PLQY, photoluminescence quantum yield, %) of the surface-etched InP quantum dots according to Comparative Example 4 (InP—Zn(OA)$_2$) and the surface-modified quantum dots according to Example 3 (InP—Zn(OA)$_2$-ZCT).

An integrating sphere was mounted on Fluoromax-4 (Horiba) of the quantum dots according to the examples and the comparative examples to obtain photoluminescence spectra, which was used to calculate a photoluminescence quantum yield (PLQY, %), and the results are shown in Table 1. The results of Table 1 are an average of three measurements. Among them, the photoluminescence quantum yields of the surface-etched InP quantum dots (Comparative Example 4, InP—Zn OA)$_2$ and the surface-modified quantum dots (Example 3, InP—Zn(OA)$_2$-ZCT) are shown in FIG. 13. In addition, the photoluminescence quantum yields of the surface-etched In(Zn)P quantum dots (In(Zn)P—Zn(OA)$_2$) of Comparative Example 8, the surface-etched and TOP-surface treated In(Zn)P quantum dots (In(Zn)P—Zn(OA)$_2$-TOP) of Comparative Example 9, and the surface-modified quantum dots (In(Zn)P—Zn(OA)$_2$-ZCT) of Example 2 are shown in FIG. 14.

TABLE 1

| | | PLQY (%) |
|---|---|---|
| Comparative Example 1 | Bare InP | less than 1% |
| Comparative Example 4 | InP—Zn (OA)$_2$ | 16.10% |
| Comparative Example 5 | InP—Zn (OA)$_2$—TOP | 19.30% |
| Example 3 | InP—Zn (OA)$_2$—ZnCl$_2$/TOP | 59.80% |
| Comparative Example 2 | In(Zn)P | less than 1% |
| Comparative Example 7 | In(Zn)P—TOP | less than 1% |
| Comparative Example 8 | In(Zn)P—Zn (OA)$_2$ | 14.30% |
| Comparative Example 9 | In(Zn)P—Zn (OA)$_2$—TOP | 11.10% |
| Example 4 | In(Zn)P—Zn (OA)$_2$—ZnCl$_2$/TOP | 48% |

Figure 14:
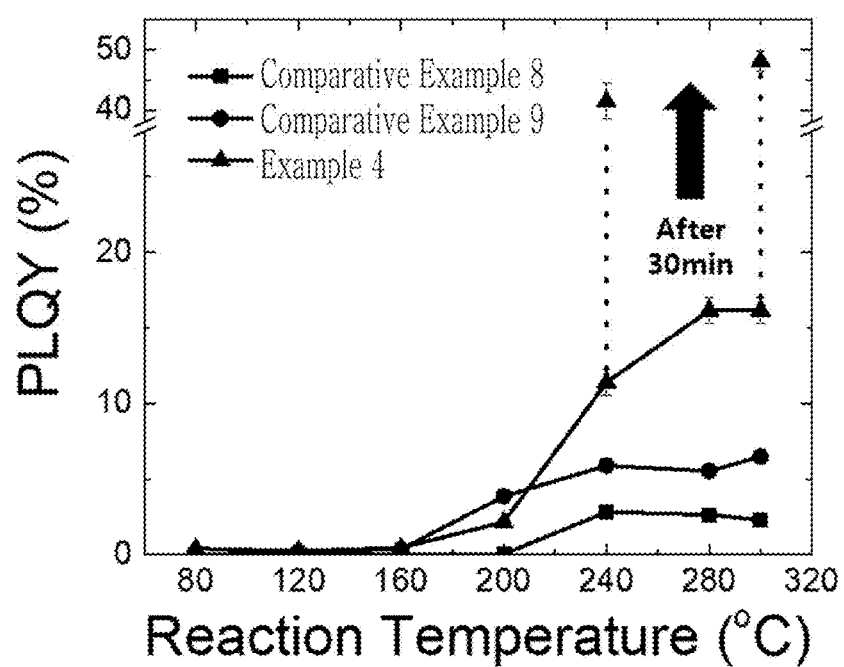
FIG. 14 is the surface-etched In(Zn)P quantum dots (In(Zn)P—Zn(OA)$_2$) according to Comparative Example 8, the surface-etched and TOP-treated In(Zn)P quantum dots (In(Zn)P—Zn(OA)$_2$-TOP) according to Comparative Example 9, and the quantum dots (In(Zn)P—Zn(OA)$_2$-ZCT) surface-modified according to Example 2.

Referring to Table 1 and FIGS. 13 and 14, the photoluminescence efficiency of the quantum dots of the examples exhibited an excellent photoluminescence quantum yield, compared with that of the quantum dots of the comparative examples. Particularly, as shown in FIG. 13, the surface-modified quantum dots of Example 1 exhibited about twice or more excellent photoluminescence quantum yield, compared with the surface-treated quantum dots of Comparative Example 4.

Evaluation Example 5: Device Evaluation

The light emitting diodes (LED) respectively including the quantum dots according to the comparative examples and the examples were measured with respect to I-V characteristics by using a source meter (2602A, Keithley) and luminance (brightness) by using a luminance meter (PR670, Spectrascan). Among them, the I-V characteristics of the light emitting devices respectively including the quantum dots according to Comparative Example 15 and Example 10 are shown in FIG. 15, and the luminance thereof is shown in FIG. 16.

Figure 15:
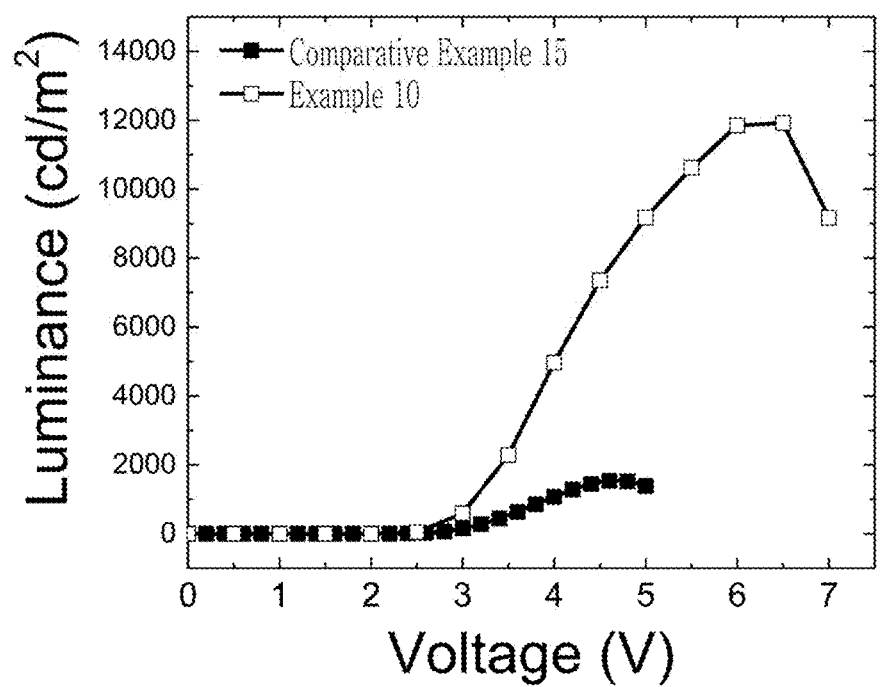
FIG. 15 is a graph showing I-V characteristics of the light emitting devices including quantum dots according to Comparative Examples 15 and 10.
Figure 16:
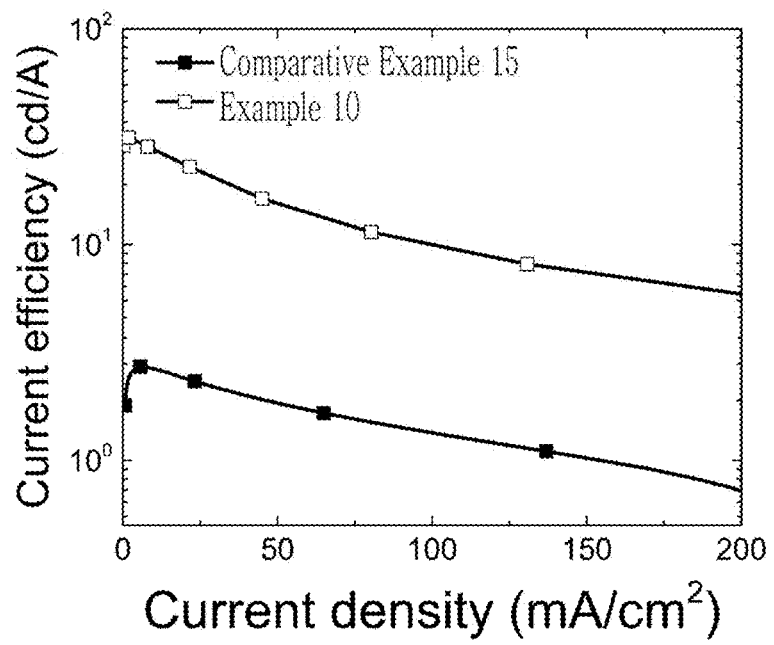
FIG. 16 is a graph showing luminescence characteristics of light emitting devices including quantum dots according to Comparative Examples 15 and 10.

FIG. 15 is a graph showing the I-V characteristics of the light emitting devices including quantum dots according to Comparative Examples 15 and Example 10, and FIG. 16 is a graph showing the luminescence characteristics of the light emitting devices including the quantum dots according to Comparative Examples 15 and Example 10. Referring to FIGS. 15 and 16, the light emitting devices respectively including the quantum dots according to Example 10 exhibited significantly improved I-V characteristics and luminescence characteristics, compared with the light emitting device including the quantum dots according to Comparative Example 15.

Evaluation Example 6: Evaluation of Trap Density

Effects according to types of Group 15 elements used for the surface modification of the semiconductor nanocrystals were compared as follows.

First, InP slab structures were generated for computational simulation of the exposed (100)P and (111)P terminal surfaces in the InP semiconductor nanocrystals. The indium (In) or phosphorus (P) terminal surfaces of the generated structures were surface-treated with compounds shown in Table 2, respectively, in a ratio of 50% of surface dangling bonds (hereinafter, referred to as 0.5 ML (monolayer)) to stabilize (passivate) the exposed surfaces of the InP semiconductor nanocrystals. The surface treated InP semiconductor nanocrystals were calculated with respect to electron structures through first-principle-based DFT (density functional theory) computational simulation, which was used to extract density of state. When $E-E_F$ ($E_F$ is a Fermi level of electrons) was 0 eV, an area of a peak in a section corresponding to the bandgap means an amount of electrons in trap states. A trap ratio was calculated as a sum of electron states of a valence band relative to an area of the trap states in the bandgap, and trap ratios depending on a surface-modifying compound are shown in Table 2.

TABLE 2

| Surface-treatment | Trap ratio (%) | |
|---|---|---|
| compound | 100P | 111P |
| Bare InP (ref.) | 1.22 | 0.98 |
| Surface-oxidized InP | 0.79 | 0.71 |
| CH$_3$NH$_2$ | 1.55 | 0.71 |
| PH$_3$ | 0.21 | 0.2 |
| Cl | 0.08 | 3.11 |
| ZnCl$_2$ | 0.07 | 0.02 |
| ZnCl$_2$/Cl | 0.07 | 0.54 |
| ZnCl$_2$/PH$_3$ | 0.01 | 0.02 |
| ZnCl$_2$/CH$_3$NH$_2$ | 0.03 | 0.01 |

Referring to Table 2, when surface-stabilized (passivated) by using ZnCl$_2$/PH$_3$ and ZnCl$_2$/CH$_3$NH$_2$, which was a combination of the compound of Chemical Formula 2 and the compound of Chemical Formula 3, as a surface-modifying compound, a significantly lower trap ratio was obtained, compared with that of bare InP or surface-oxidized InP. On the other hand, compared with a case of using the compound represented by Chemical Formula 3, a Group 15 element-containing compound (CH$_3$NH$_2$, PH$_3$) alone or the compound represented by Chemical Formula 2, metal salt (ZnCl$_2$, ZnCl$_2$/Cl) or a halogen element (Cl) alone, a ligand complex formed by reacting them and represented by Chemical Formula 1 (ZnCl$_2$/PH$_3$, ZnCl$_2$/CH$_3$NH$_2$) exhibited a higher trap ratio and thus provided more excellent surface modifying effects.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: light emitting device 11: first electrode
12: hole auxiliary layer 13: light emitting layer
14: electron auxiliary layer 15: second electrode

What is claimed is:

1. A quantum dot surface-modified with a ligand complex represented by Chemical Formula 1:

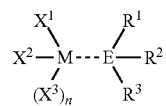

[Chemical Formula 1]

wherein, in Chemical Formula 1,
M is a divalent or trivalent metal excluding indium,
X$^1$ and X$^2$ are each independently a halogen,
n is 0 or 1,
E is a Group 15 element, and
R$^1$, R$^2$, and R$^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

2. The quantum dot of claim 1, wherein
the divalent or trivalent metal (M) includes zinc (Zn), cadmium (Cd), mercury (Hg), gallium (Ga), aluminum (Al), magnesium (Mg), strontium (Sr), calcium (Ca), barium (Ba), or a combination thereof.

3. The quantum dot of claim 1, wherein
the Group 15 element (E) includes nitrogen (N), phosphorus (P), arsenic (As), antimony (Sb), bismuth (Bi), or a combination thereof.

4. The quantum dot of claim 1, further comprising:
a semiconductor nanocrystal including a Group III-V compound.

5. The quantum dot of claim 4, wherein
the Group III-V compound further includes a Group II element.

6. The quantum dot of claim 1, wherein
the quantum dot exhibits an area of an oxide peak (about −50 ppm to about 50 ppm) reduced by about 10% or more compared with a quantum dot that is not surface-modified during $^1$H-$^{31}$P CP MAS (Cross-polarization Magic Angle Spinning) solid state NMR analysis.

7. The quantum dot of claim 1, wherein
the quantum dot exhibits an increased photoluminescence quantum yield (PLQY) of about 30% or more with respect to the quantum dot that is not surface-modified.

8. The quantum dot of claim 1, wherein
the quantum dot exhibits an area of an oxide peak (about 132 eV to about 134 eV) reduced by about 10% or more compared with a quantum dot prepared using a core that is not surface-modified during X-ray photoelectron spectroscopy (XPS) analysis.

9. A quantum dot, comprising
a core including a first semiconductor nanocrystal and
a shell including a second semiconductor nanocrystal having a different composition from the first semiconductor nanocrystal,
wherein the first semiconductor nanocrystal is a quantum dot surface-modified with a ligand complex represented by Chemical Formula 1:

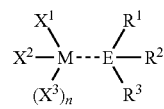

[Chemical Formula 1]

wherein, in Chemical Formula 1,
M is a divalent or trivalent metal excluding indium,
X$^1$, X$^2$, and X$^3$ are each independently a halogen,
n is 0 or 1,
E is a Group 15 element, and
R$^1$, R$^2$, and R$^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

10. The quantum dot of claim 9, wherein
the divalent or trivalent metal (M) includes zinc (Zn), cadmium (Cd), mercury (Hg), gallium (Ga), aluminum (Al), magnesium (Mg), strontium (Sr), calcium (Ca), barium (Ba), or a combination thereof.

11. The quantum dot of claim 9, wherein
the Group 15 element (E) includes nitrogen (N), phosphorus (P), arsenic (As), antimony (Sb), bismuth (Bi), or a combination thereof.

12. The quantum dot of claim 9, wherein
the semiconductor nanocrystal is a Group III-V compound.

13. The quantum dot of claim 12, wherein
the Group III-V compound further includes a Group II element.

14. The quantum dot of claim 9, wherein
the shell includes a Group II-IV compound.

15. The quantum dot of claim 13, wherein
the Group II-IV compound includes ZnS, ZnSe, or a combination thereof.

16. The quantum dot of claim 9, wherein
the quantum dot exhibits an increased photoluminescence quantum yield (PLQY) of about 30% or more with respect to the quantum dot that is not surface-modified.

17. A method for preparing a surface-modified quantum dot, comprising:
injecting a non-metal precursor solution into a reaction solution prepared by injecting a metal precursor into a solvent and reacting them to prepare a semiconductor nanocrystal solution; and injecting a ligand complex represented by Chemical Formula 1 or a solution containing the same into the semiconductor nanocrystal solution, or injecting a compound represented by Chemical Formula 2 and a compound represented by Chemical Formula 3 into the semiconductor nanocrystal solution to form the ligand complex represented by Chemical Formula 1 on the surface of the semiconductor nanocrystal:

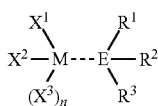
[Chemical Formula 1]

wherein, in Chemical Formula 1,
M is a divalent or trivalent metal excluding indium,
$X^1$, $X^2$, and $X^3$ are each independently a halogen,
n is 0 or 1,
E is a Group 15 element, and
$R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof:

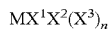    [Chemical Formula 2]

wherein, in Chemical Formula 2,
M is a divalent or trivalent metal excluding indium,
$X^1$, $X^2$, and $X^3$ are each independently a halogen, and
n is 0 or 1,

    [Chemical Formula 3]

wherein, in Chemical Formula 3,
E is a Group 15 element, and
$R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

18. The method of claim 17, wherein
the method for preparing a surface-modified quantum dot further includes adding a metal salt compound represented by Chemical Formula 4 to the semiconductor nanocrystal solution to etch the surface of the semiconductor nanocrystal before injection of the ligand complex represented by Chemical Formula 1 or the solution containing the same or before injection of the compound represented by Chemical Formula 2 and the compound represented by Chemical Formula 3:

    [Chemical Formula 4]

wherein, in Chemical Formula 4,
M' is a monovalent, divalent, or trivalent metal,
m is an integer of 1 to 3, and
Y is a linear or branched alkyl group, a linear or branched alkenyl group, or a linear or branched alkynyl group which includes a functional group having a C(=O)O— group.

19. A method of preparing a core-shell quantum dot, comprising:

injecting a non-metal precursor solution into a reaction solution prepared by injecting a metal precursor into a solvent and reacting them to prepare a first semiconductor nanocrystal solution;
injecting a ligand complex represented by Chemical Formula 1 or a solution containing the same into the first semiconductor nanocrystal solution, or injecting a compound represented by Chemical Formula 2 and a compound represented by Chemical Formula 3 into the semiconductor nanocrystal solution to form the ligand complex represented by Chemical Formula 1 on a surface of the first semiconductor nanocrystal; and
forming a shell including a second semiconductor nanocrystal on the surface of the surface-modified first semiconductor nanocrystal:

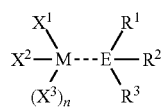
[Chemical Formula 1]

wherein, in Chemical Formula 1,
M is a divalent or trivalent meta excluding indium,
$X^1$, $X^2$, and $X^3$ are each independently a halogen,
n is 0 or 1,
E is a Group 15 element, and
$R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof,

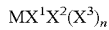    [Chemical Formula 2]

wherein, in Chemical Formula 2,
M is a divalent or trivalent metal excluding indium,
$X^1$, $X^2$, and $X^3$ are each independently a halogen, and
n is 0 or 1,

    [Chemical Formula 3]

wherein, in Chemical Formula 3,
E is a Group 15 element, and
$R^1$, $R^2$, and $R^3$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroaryl group, or a combination thereof.

20. The method of claim 19, wherein
the method for preparing a core-shell quantum dot further includes adding a metal salt compound represented by Chemical Formula 4 to the first semiconductor nanocrystal solution to etch the surface of the first semiconductor nanocrystal before injection of the ligand complex represented by Chemical Formula 1 or the solution containing the same or before injection of the compound represented by Chemical Formula 2 and the compound represented by Chemical Formula 3:

    [Chemical Formula 4]

wherein, in Chemical Formula 4,
M' is a monovalent, divalent, or trivalent metal,
m is an integer of 1 to 3, and Y is a linear or branched alkyl group, a linear or branched alkenyl group, or a linear or branched alkynyl group which includes a functional group having a C(=O)O— group.

21. A quantum dot-polymer composite, comprising
a polymer matrix and a plurality of the quantum dots and
a polymer matrix in which the quantum dots are disposed,
wherein the quantum dots include the quantum dot of claim 1.

22. A quantum dot-polymer composite, comprising
a polymer matrix and a plurality of the quantum dots and
a polymer matrix in which the quantum dots are disposed,
wherein the quantum dots include the quantum dot of claim 9.

23. An electronic device comprising the quantum dot of claim 1.

24. The electronic device of claim 23, wherein
the electronic device includes a light emitting diode (LED), an organic light emitting diode (OLED), a sensor, a solar cell, an imaging sensor, or a liquid crystal display device.

25. An electronic device comprising the quantum dot of claim 9.

26. The electronic device of claim 25, wherein
the electronic device includes a light emitting diode (LED), an organic light emitting diode (OLED), a sensor, a solar cell, an imaging sensor, or a liquid crystal display device.

* * * * *